(12) United States Patent
Koba et al.

(10) Patent No.: US 9,354,278 B2
(45) Date of Patent: May 31, 2016

(54) DEVICE FOR DETECTING NORMAL, ABNORMAL OR DETERIORATED BATTERY STATE

(71) Applicant: Primearth EV Energy Co., Ltd., Kosai-shi, Shizuoka (JP)

(72) Inventors: Daisuke Koba, Toyohashi (JP); Sachio Takeda, Toyohashi (JP); Katsunori Maegawa, Toyohashi (JP); Naoto Sato, Kosai (JP); Tetsuya Osaka, Nishitokyo (JP)

(73) Assignee: Primearth EV Energy Co., Ltd., Kosai-shi (JP)

( * ) Notice: Subject to any disclaimer, the term of this patent is extended or adjusted under 35 U.S.C. 154(b) by 167 days.

(21) Appl. No.: 14/343,720

(22) PCT Filed: Jan. 23, 2013

(86) PCT No.: PCT/JP2013/051343
§ 371 (c)(1),
(2) Date: Mar. 7, 2014

(87) PCT Pub. No.: WO2013/115038
PCT Pub. Date: Aug. 8, 2013

(65) Prior Publication Data
US 2014/0218042 A1 Aug. 7, 2014

(30) Foreign Application Priority Data

Jan. 31, 2012 (JP) .................................. 2012-018745
Feb. 17, 2012 (JP) .................................. 2012-032606

(51) Int. Cl.
*H01M 10/46* (2006.01)
*G01R 31/36* (2006.01)

(52) U.S. Cl.
CPC ........ *G01R 31/3662* (2013.01); *G01R 31/3651* (2013.01); *G01R 31/3679* (2013.01); *G01R 31/3624* (2013.01)

(58) Field of Classification Search
CPC ..... G01R 31/36; G01N 27/27; G01N 27/416; G01N 27/4166
USPC .......... 320/132, 149, 151, 156, 161; 324/426, 324/427, 430, 433
See application file for complete search history.

(56) References Cited

U.S. PATENT DOCUMENTS 4,743,855 A    5/1988 Randin
5,241,275 A    8/1993 Fang
(Continued)

FOREIGN PATENT DOCUMENTS

DE    10 2009 000337.1    7/2010
EP    0 146 093 A2    6/1985
(Continued)

OTHER PUBLICATIONS

Blanke, H., et al., "Impedance Measurements on Lead-Acid Batteries for State-of Charge, State-of-Health and Cranking Capability Prognosis in Electric and Hybrid Electric Vehicles," Journal of Power Sources 144(2):418-425, Jun. 15, 2005.
(Continued)

*Primary Examiner* — Edward Tso
(74) *Attorney, Agent, or Firm* — Christensen O'Connor Johnson Kindness PLLC

(57) ABSTRACT

This device and method use the complex impedance of a rechargeable battery to detect the state of the rechargeable battery. A computer determines the slope of the complex impedance at least two different frequencies in a diffusion region of the rechargeable battery when a straight-line approximation has been made, and compares the slope with a threshold value. If the slope is greater than or equal to the threshold value, the computer determines that the battery has a normal capacity balance, and if the slope is less than the threshold value, the computer determines that the battery has an abnormal unbalanced capacity. Furthermore, if the magnitude of an imaginary axis component of the complex impedance in the diffusion region of the rechargeable battery is greater than the threshold battery, the computer determines that the battery has an abnormal capacity balance, and if said magnitude is less than or equal to the threshold value, the computer determines that the battery has a normal capacity balance.

11 Claims, 18 Drawing Sheets

(56) References Cited

U.S. PATENT DOCUMENTS

| | | | |
|---|---|---|---|
| 6,477,024 B1* | 11/2002 | Kikuchi | G01R 1/3624 324/430 |
| 2001/0028238 A1 | 10/2001 | Nakamura | |
| 2002/0030495 A1* | 3/2002 | Kechmire | G01R 31/3648 324/427 |
| 2012/0019253 A1 | 1/2012 | Ziegler | |
| 2014/0229130 A1 | 8/2014 | Koba | |

FOREIGN PATENT DOCUMENTS

| | | |
|---|---|---|
| EP | 0 516 336 A2 | 12/1992 |
| JP | 60-144675 A | 7/1985 |
| JP | 4-43975 A | 2/1992 |
| JP | 4-141966 A | 5/1992 |
| JP | 05-135806 A | 6/1993 |
| JP | 5-135806 A | 6/1993 |
| JP | 08-043506 A | 2/1996 |
| JP | 10-232273 A | 9/1998 |
| JP | 2000-299137 A | 10/2000 |
| JP | 2011-158444 A | 2/2011 |

OTHER PUBLICATIONS

Extended European Search Report mailed Sep. 1, 2015, issued in corresponding European Patent Application No. EP 13744278.6, filed Jan. 23, 2013, 9 pages.

International Search Report mailed May 7, 2013, issued in corresponding International Application No. PCT/JP2013/051343, filed Jan. 23, 2013, 5 pages.

Koba, D. et al., "State of Charge Detection Device," U.S. Appl. No. 14/343,743, filed Mar. 7, 2014.

Kodama, M., et al., "Performance Improvement of the Nickel Metal Hydride Battery,"Yusa-Jiho Technical Review, No. 95, Oct. 2003, pp. 7-11.

Morishita, S., "Electrochemical Impedance Analysis of Negative Electrodes of Ni-MH Batteries," R&D Review of Toyota CRDL 34(3):63-70, Sep. 1999.

Nitta, Y., et al., "High-Capacity Nickel-Metal Hydride Battery for Consumer Type," Matsushita Technical Journal 53(4):64-69, Aug. 2006.

Do, D.V., et al., "Impedance Observer for a Li-Ion Battery Using Kalman Filter," IEEE Transactions on Vehicular Technology 58(8):3930-3937, Oct. 2009.

Extended European Search Report mailed Mar. 24, 2015, issued in European Patent Application No. Ep 12 86 7453, filed Sep. 26, 2012, 8 pages.

International Preliminary Report on Patentability mailed Aug. 5, 2014, issued in International Application No. PCT/JP2012/074722, filed Sep. 26, 2012, 9 pages.

International Preliminary Report on Patentability mailed Aug. 5, 2014, issued in corresponding International Application No. PCT/JP2013/051343, filed Jan. 23, 2013, 8 pages.

Notice of Grounds for Rejection mailed Mar. 15, 2016, issued in corresponding Japanese Applicatio No. 2013-556195, filed Sep. 26, 2012, 5 pages.

* cited by examiner

DEVICE FOR DETECTING NORMAL, ABNORMAL OR DETERIORATED BATTERY STATE

TECHNICAL FIELD

The present invention relates to a battery state detection device and, more particularly, to a technique of detecting a state of a rechargeable battery by analysis of complex impedances.

BACKGROUND ART

A technique of evaluating a state of deterioration a battery and its remaining lifetime by analysis of impedances of the battery has hitherto been proposed.

For instance; Patent Document 1, describes a method for measuring a state of an electrical discharge of a battery having internal impedance. The method includes measuring a first internal impedance of the battery at a first frequency; measuring a second internal impedance of the battery at a second frequency; determining a difference between the first internal impedance and the second internal impedance; and determining a deflection angle or an argument that represents the difference between the internal impedances; in other words, a deflection angle or an argument that represents a state of an electrical discharge of the battery. Further, the first frequency or the second frequency, whichever is lower, exists between 0.1 Hz and 10 Hz.

Patent Document 2 includes a description about detecting a quantity of electricity associated with impedance of a rechargeable battery or a quantity of electricity associated with maximum output density by application of an AC voltage to the rechargeable battery and determining performance of the rechargeable battery on the basis of the quantity of electricity. Another description also states that the quantity of electricity is an AC-impedance-associated electrical quantity associated with, of impedances of the rechargeable battery, an AC impedance component made up of a component which varies according to a frequency of an AC voltage. Still another description states that a real-axis component value and an imaginary-axis component value of an impedance of the rechargeable battery are determined for each frequency value by applying AC voltages of a plurality of frequency values in a predetermined frequency band to the rechargeable battery and that a quantity of electricity associated with impedance is calculated from the real-axis component value and the imaginary-axis component value. A further additional description states that an AC impedance component is calculated from a circular locus of impedance in a two-dimensional plane defined by an axis representing the real-axis component values and another axis representing the imaginary-axis component values.

RELATED ART DOCUMENTS

Patent Documents

Patent Document 1: JP-A-60-144675
Patent Document 2: JP-A-2000-299137

SUMMARY OF THE INVENTION

Incidentally, along with the recent popularization of hybrid automobiles and pure electric vehicles, establishing technology of detecting a state of a rechargeable battery mounted in such a vehicle with high accuracy has become imperative. Applications of the technology to controlling the rechargeable battery mounted in a vehicle and recycling the rechargeable battery can be expected. For instance, on the occasion of recycling of a rechargeable battery, a technique of determining whether or not the rechargeable battery is recyclable, from battery characteristics (an open circuit voltage, internal resistance, remaining capacity, and the like) of the rechargeable battery taken out of the vehicle has already been put forward. However, in order to make a more accurate determination as to whether or not the rechargeable battery is recyclable, a technique of detecting a state of a rechargeable battery more accurately has been desired. In addition, the patent documents include a description about detecting a state of a rechargeable battery by means of an impedance. However, the state of the battery is detected by use of an impedance in a so-called charge transfer resistance region, and it cannot necessarily be said that the state of the battery is sufficiently detected. In relation to; for instance, a nickel-metal hydride battery, even when a change has occurred in an SOC, no change appears in the impedance in the charge transfer resistance region. Therefore, the state of the battery cannot be estimated from the impedance in the charge transfer resistance region.

The present invention aims at providing a device capable of detecting a state of a battery; in particular, whether the battery is normal or abnormal or a degree of deterioration of the battery, with high accuracy by analysis of complex impedances of the battery.

The present invention provides a battery state detection device that detects whether a battery is normal or abnormal or a degree of deterioration of the battery, comprising: measurement means for measuring complex impedances in a diffusion region of the battery; detection means for calculating a slope of a straight light or an approximate straight line which connects together two complex impedances or more of different frequencies in a diffusion region of the battery measured by the measurement means; and storage means that preliminarily stores a threshold value corresponding to the slope used for determining whether the battery is normal or abnormal or the degree of deterioration of the battery, wherein the detection means detects whether the battery is normal or abnormal or the degree of deterioration of the battery by use of the predetermined threshold value stored in the storage means and the calculated slope.

An embodiment of the present invention is characterized in that the two complex impedances or more of different frequencies are complex impedances which occur at an identical state of charge.

Another embodiment of the present invention is characterized in that the state of charge is zero or thereabouts.

Still another embodiment of the present invention is characterized in that the detection means calculates the slope of the straight line or the approximate straight line that connects together the two complex impedances or more of different frequencies, by use of a two-dimensional plane defined by an axis of real-axis components and an axis of imaginary-axis components.

The present invention also provides a battery state detection device that detects whether a battery is normal or abnormal or a degree of deterioration of the battery, comprising: measurement means for measuring a complex impedance in a diffusion region of the battery which is identical with a frequency of a reference complex impedance, or a complex impedance in a diffusion region, of a base battery that serves as a reference on occasion of comparison of the battery; detection means for detecting a distance between the reference complex impedance and the complex impedance measured by the measurement means and a slope of a straight line that connects the reference complex impedance to the complex impedance measured by the measurement means; and storage means that preliminarily stores a threshold value corresponding to the distance and a threshold value corresponding to the slope, which are used for determining whether the battery is normal or abnormal or the degree of deterioration of the battery, wherein the detection means detects whether the battery is normal or abnormal or the degree of deterioration of the battery by use of the calculated distance, the calculated slope, a threshold value corresponding to the distance stored in the storage means, and a threshold value corresponding to the slope stored in the storage means.

An embodiment of the present invention is characterized in that the reference complex impedance and the complex impedance measured by the measurement means are complex impedances which occurs at an identical state of charge.

Another embodiment of the present invention is characterized in that the state of charge is zero or thereabouts.

Still another embodiment of the present invention is characterized in that the detection means detects, by use of a two-dimensional plane defined by an axis of real-axis components and an axis of imaginary-axis components, a distance between the complex impedance measured by the measurement means and the reference complex impedance and a slope of a straight line that connects the complex impedance measured by the measurement means to the reference complex impedance.

The present invention further provides a battery state detection device for detecting whether a battery is normal or abnormal, comprising: measurement means for measuring a complex impedance of a first frequency in a diffusion region of the battery; detection means for calculating at least any one of a real-axis component, an imaginary-axis component, and a magnitude of the complex impedance of the first frequency measured by the measurement means; and storage means that preliminarily stores a predetermined threshold value corresponding to at least any one of the real-axis component, the imaginary-axis component, and the magnitude of the complex impedance of the first frequency, which is acquired by the measurement means and used for determining whether the battery is normal or abnormal, wherein the detection means detects whether the battery is normal or abnormal by comparing at least any one of the real-axis component, the imaginary-axis component, and the magnitude of the complex impedance of the first frequency with a threshold value corresponding to at least any one of the real-axis component, the imaginary-axis component, and the magnitude of the complex impedance of the first frequency stored in the storage means.

An embodiment of the present invention is characterized in that, when the detection means has detected that the battery is abnormal, the measurement means measures a complex impedance of a second frequency which is lower than the first frequency in the diffusion region of the battery; the detection means calculates at least one of a real-axis component, an imaginary-axis component, and a magnitude of the complex impedance of the second frequency measured by the measurement means; the storage means preliminarily stores a predetermined threshold value corresponding to at least anyone of the real-axis component, the imaginary-axis component, and the magnitude of the complex impedance of the second frequency that is acquired by the measurement means and used for determining the battery is normal or abnormal; and the detection means detects whether the battery is normal or abnormal by comparing at least any one of the real-axis component, the imaginary-axis component, and the magnitude of the complex impedance of the second frequency with a threshold value corresponding to at least any one of the real-axis component, the imaginary-axis component, and the magnitude of the complex impedance of the second frequency stored in the storage means.

Another embodiment of the present invention is characterized in that the measurement means measures a complex impedance which occurs when the state of charge of the battery is zero or thereabouts.

The present invention enables highly accurate detection of a state of a battery by means of analysis of complex impedances of a battery; more specifically, detection of whether a battery to be detected is normal or abnormal or whether or not the battery is deteriorated. Accordingly, recycling efficiency can be enhanced by application of the present invention to; for instance, an occasion of accurate control of a vehicle-mounted battery or recycling of the battery.

EMBODIMENTS FOR IMPLEMENTING THE INVENTION

Embodiments of the invention are hereunder described by reference to the drawings.

<Fundamental Principle>

A basic principle underlying embodiments is first described. A device and a method for detecting a state of a rechargeable battery described in connection with the embodiment are intended for detecting a state of a rechargeable battery by focusing attention on one among other behaviors of the complex impedance of the rechargeable battery in a specific frequency region. Explanations are provided hereunder by taking a nickel-metal hydride battery (Ni-MH battery) as, by way of example, a rechargeable battery. The invention; however, is not limited to the nickel-metal hydride battery and can also be utilized for; e.g., another alkaline battery or a nonaqueous battery, such as a lithium battery.

Figure 1:
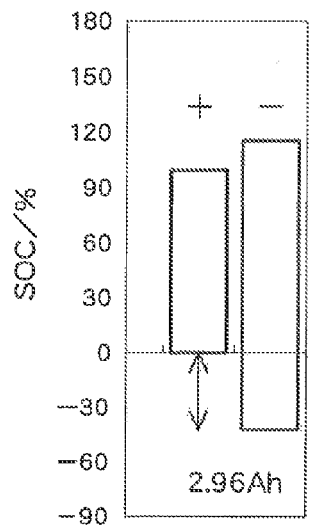
FIG. 1 It is a chart illustrating a normal capacity balance.

FIG. 1 illustrates capacity of a positive electrode and capacity of a negative electrode of a normal nickel-metal hydride battery. The nickel-metal hydride battery prevents a rise in internal pressure, which would otherwise occur as a result of building up of a gas during an excessive recharge, by causing the negative electrode to absorb oxygen during the excessive recharge and also by setting the capacity of the negative electrode (a charge reserve) so as to become in excess of the capacity of the positive electrode such that the negative electrode itself does not evolve hydrogen. Moreover, a dischargeable capacity (a discharge reserve) is provided on the negative electrode such that the capacity of the battery is not regulated by the capacity of the negative electrode during discharge. To be more specific, a balance between the capacity of the positive electrode and the capacity of the negative electrode is set such that a discharge capacity of the nickel-metal hydride battery is regulated by the capacity of the positive electrode. As illustrated in FIG. 1, a charge reserve and a discharge reserve exist in the normal nickel-metal hydride battery. When attention is focused on a discharge side, the discharge reserve is positive (for instance, 2.96 Ah as illustrated in FIG. 1).

Figure 2:
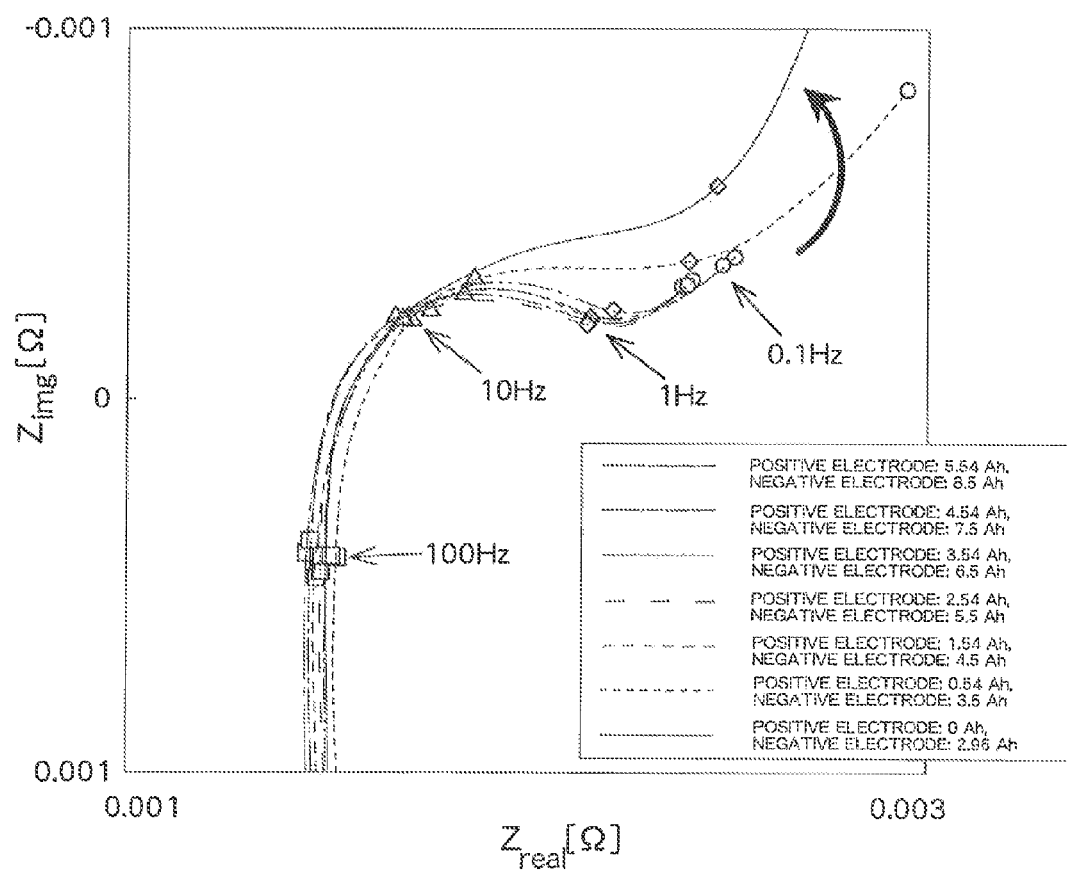
FIG. 2 It is a complex impedance chart (a Nyquist plot) of a battery illustrated in FIG. 1.

FIG. 2 illustrates complex impedance curves made by connecting together complex impedances of a circuit that is equivalent to the application of AC voltages to a normal battery in a discharged state. The equivalent circuit and the complex impedance are known and exactly as described even in connection with; for instance, Patent Document 2. To put it briefly, an impedance of a battery is expressed by an equivalent circuit including a DC impedance component and an AC impedance component that are connected in series, and the AC impedance component is made equivalent to a parallel circuit including a resistor and a capacitor. The AC impedance component is obtained as $Z=Vac/Iac=Zrea+jZimg$ by eliminating the DC voltage component from a voltage across the battery to thus detect an AC voltage component Vac and an AC current Iac applied to both terminals of the battery. Reference symbol Zreal is a real-axis component of a complex impedance, and reference symbol Zimg is an imaginary-axis component of the complex impedance. FIG. 2 illustrates that a real-axis component and an imaginary-axis component of a complex impedance of the normal battery illustrated in FIG. 1 are determined and that a pair of data including the real-axis component and the imaginary-axis component are plotted on a two dimensional plane defined by a horizontal axis Zr representing real-axis components Zr and a vertical axis representing imaginary-axis components Zi (i.e., a Nyquist plot: a right side of the horizontal axis is a plus side; left side of the same is a minus side; an upper side of the longitudinal axis is a minus side; and a lower side of the vertical axis is a plus side: and the same also applies to other Nyquist plots). Illustrated are real-axis components and imaginary-axis components of complex impedances that are acquired while a frequency applied to the battery in a discharged state is changed at given capacities (a capacity of the positive electrode (Ah), a capacity of the negative electrode (Ah))=(5.54, 8.5), (4.54, 7.5), (3.54, 6.5), (2.54, 5.5), (1.54, 4.5), (0.54, 3.5), and (0, 2.96). The chart explicitly illustrates a point of 0.1 Hz, a point of 1 Hz, a point of 10 Hz, and a point of 100 Hz. Specifically, a circular symbol denotes 0.1 Hz; a rhombic symbol denotes 1 Hz; a triangular symbol denotes 10 Hz; and a square symbol denotes 100 Hz. A low frequency region is one including complex impedances contributed to mass diffusion, and, in the embodiment, is referred to as a region, in a diffusion region, made up of complex impedances. Specifically, each of the complex impedance curves illustrated in FIG. 2 is formed from a curve portion (a charge transfer resistance region) that shows a high-frequency-side circular arc and a nearly straight portion. A portion (a nearly-straight portion) of the complex impedance curve continued from a point of inflexion up to a low frequency region is a region made up of complex impedances in the diffusion region. In the region made up of the complex impedances in the diffusion region, great changes do not occur when the capacity of the positive electrode varies between 5.54 Ah and 1.54 Ah, but a slope of the straight line becomes steep when the capacity of the positive electrode is 0 Ah and thereabouts.

Figure 3:
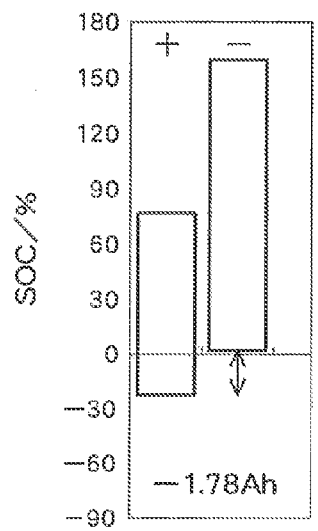
FIG. 3 It is a chart illustrating an unbalanced capacity.

FIG. 3 illustrates a battery with an imbalance between the capacity of a positive capacity and the capacity of a negative electrode. Intrinsically, the negative electrode is provided with a dischargeable capacity as illustrated in FIG. 1 such that the battery capacity is not regulated by the negative electrode during electrical discharge. However, if a capacity balance is lost, the negative electrode will become devoid of a capacity for a discharge reserve, so that the discharge reserve will become negative (for instance, −1.78 Ah as illustrated in FIG. 3). In short, the battery capacity will be regulated by the negative electrode.

Figure 4:
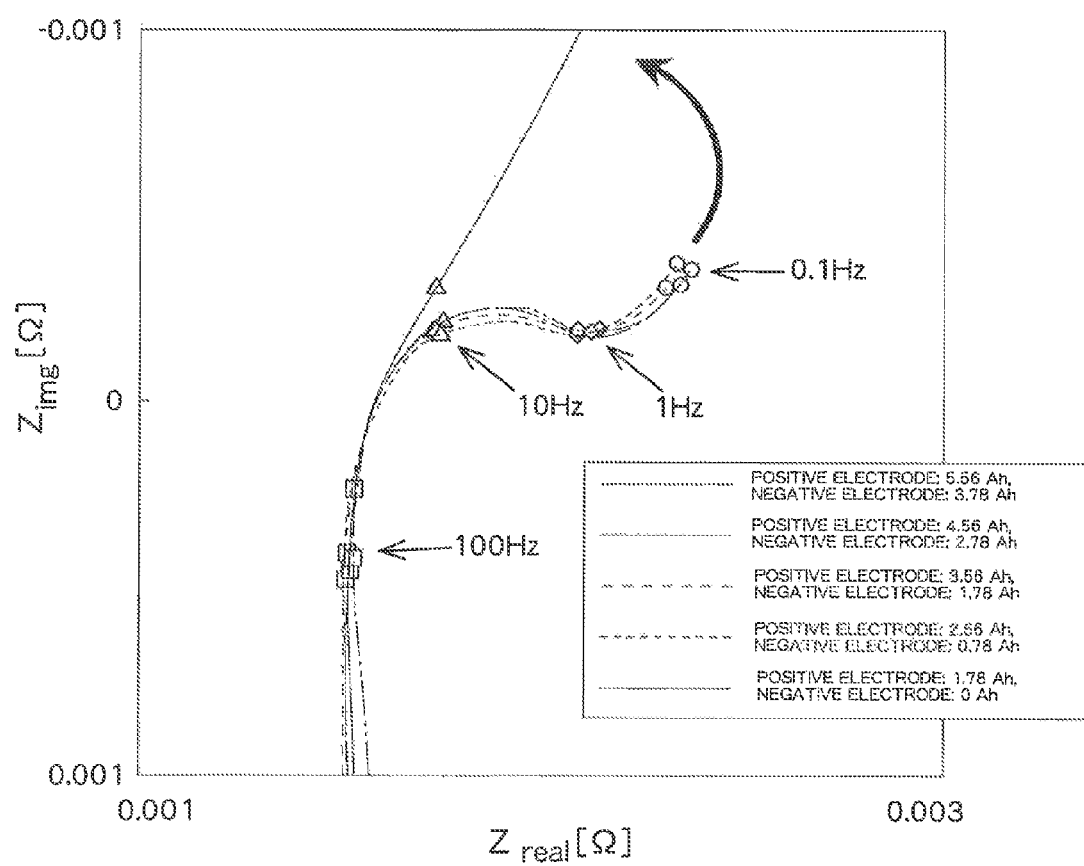
FIG. 4 It is a complex impedance chart (a Nyquist plot of a battery illustrated in FIG. 3.

FIG. 4 illustrates complex impedance curves formed by connecting complex impedances of a circuit equivalent to a case where AC voltages are applied to an abnormal battery illustrated in FIG. 3. Illustrated are real-axis components and imaginary-axis components of complex impedances that are acquired by changing a frequency while the battery in a discharged state is given capacities (a capacity of the positive electrode (Ah), a capacity of the negative electrode (Ah))= (5.56, 3.78), (4.56, 2.78), (3.56, 1.78), (2.56, 0.78), and (1.78, 0). In FIG. 2, since the battery capacity is regulated by the positive electrode, the battery is discharged until the capacity of the positive electrode comes to 0 Ah. However, in FIG. 4, attention should be paid to the fact that the battery capacity becomes regulated by the negative electrode and that the battery is discharged until the capacity of the negative electrode comes to 0 Ah. Even in FIG. 4, a region made up of complex impedance in the diffusion region lies in a nearly straight line; the straight line does not undergo any substantial change when the capacity of the negative electrode ranges between 3.78 Ah and 1.78 Ah; and the slope of the straight line becomes steep when the capacity of the negative electrode is 0 Ah and thereabouts. In this regard, a comparison between FIG. 2 and FIG. 4 shows a difference between slopes of the two straight lines each of which connects together complex impedances of different frequencies in the diffusion region, wherein the slope of the complex impedance in FIG. 4 acquired when the capacity of the negative electrode is 0 Ah is smaller than the slope of the complex impedance in FIG. 2 acquired when the capacity of the positive electrode is 0 Ah.

Figure 5:
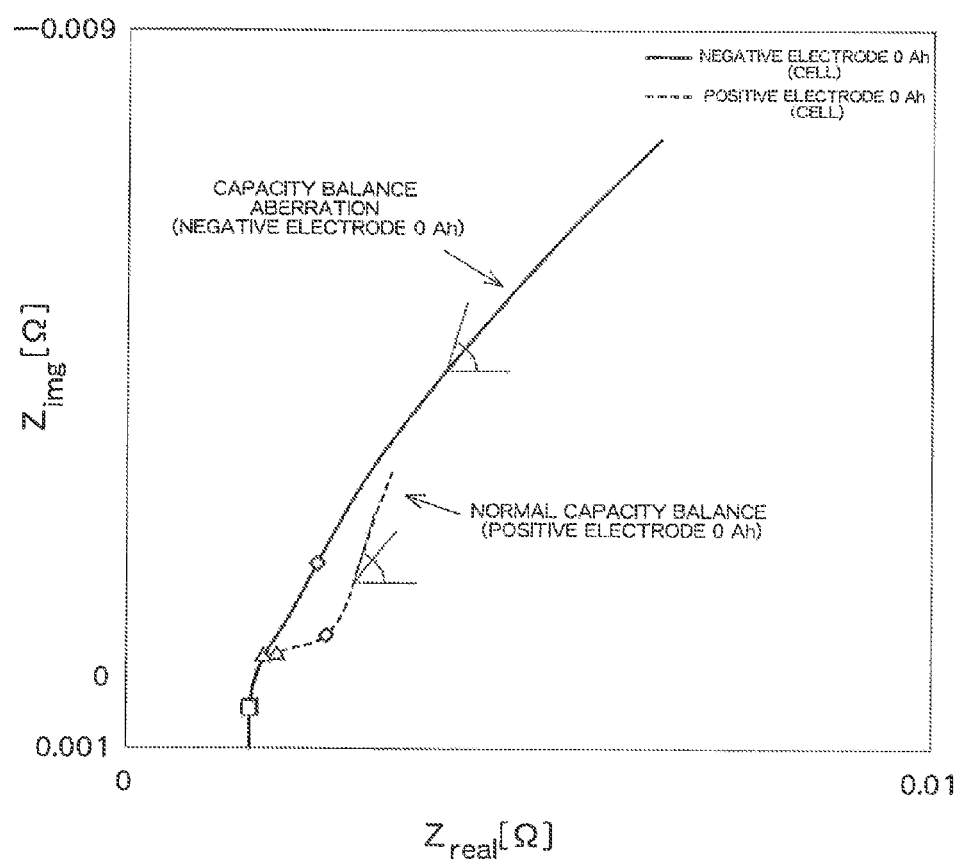
FIG. 5 It is a chart (a Nyquist plot) illustrating a relationship between a slope of a complex impedance with a normal capacity balance and a slope of a complex impedance with the unbalanced capacity.

FIG. 5 contrastingly illustrates a slope in the diffusion region of the battery with the normal capacity balance in FIG. 2 when the capacity of the positive electrode is 0 Ah and a slope in the diffusion region of the abnormal battery with the unbalanced capacity in FIG. 4 when the capacity of the negative electrode is 0 Ah. As is seen from the drawing, the slope acquired on the normal capacity balance becomes relatively smaller than the slope acquired on the abnormal capacity balance. Although a mechanism of this phenomenon is not necessarily evident, a complex impedance in the diffusion region is theoretically made up of a concentrated constant region where the slope assumes a value of 90 degrees and a distributed constant region where the slope assumes a value of 45 degrees. A frequency that is to serve as a boundary between the regions is taken as a turnover frequency. Since different diffusion behaviors of mass transfer coexist in an actual battery, the slope in the diffusion region often assumes any value in a range from 45 to 90 degrees. Further, a ratio of a behavior involving a high turnover frequency to a behavior involving a low turnover frequency changes according to deterioration of the battery that takes place concomitantly with the progress of an operating cycle of the battery or a change in the state of charge of the battery. Therefore, the slope in the diffusion region is conceived to change.

Accordingly, in the embodiment, attention is paid to such a fact of the difference between the slopes. A slope in a diffusion region of a battery that is known to have a normal capacity balance is detected and set as a threshold value. A slope in a diffusion region of a battery whose state is to be detected is detected and compared with the threshold value, thereby determining the battery to be normal or abnormal or detecting a degree of deterioration of the battery. To be specific, slopes of both batteries are compared with each other. When the slope of the battery whose state is to be detected is smaller than the threshold value, the battery is determined to be an abnormal battery with an unbalanced capacity or a deteriorated battery. The slope in the diffusion region can be determined by detecting complex impedances, at least, at two different frequencies in the diffusion region and by subjecting the complex impedances to collinear approximation.

The above is directed toward the single battery, or a so-called single cell; however, can also apply to a plurality of cells in the same manner. In the case of a plurality of cells made by a series connection of single cells, slopes of the plurality of cells correspond to an aggregate of the respective slopes of the series-connected cells. Consequently, when the slope of, at least, any one of the cells is smaller than the threshold value, the entire slope represented by the plurality of cells is expected to become smaller than the threshold value accordingly.

Figure 6:
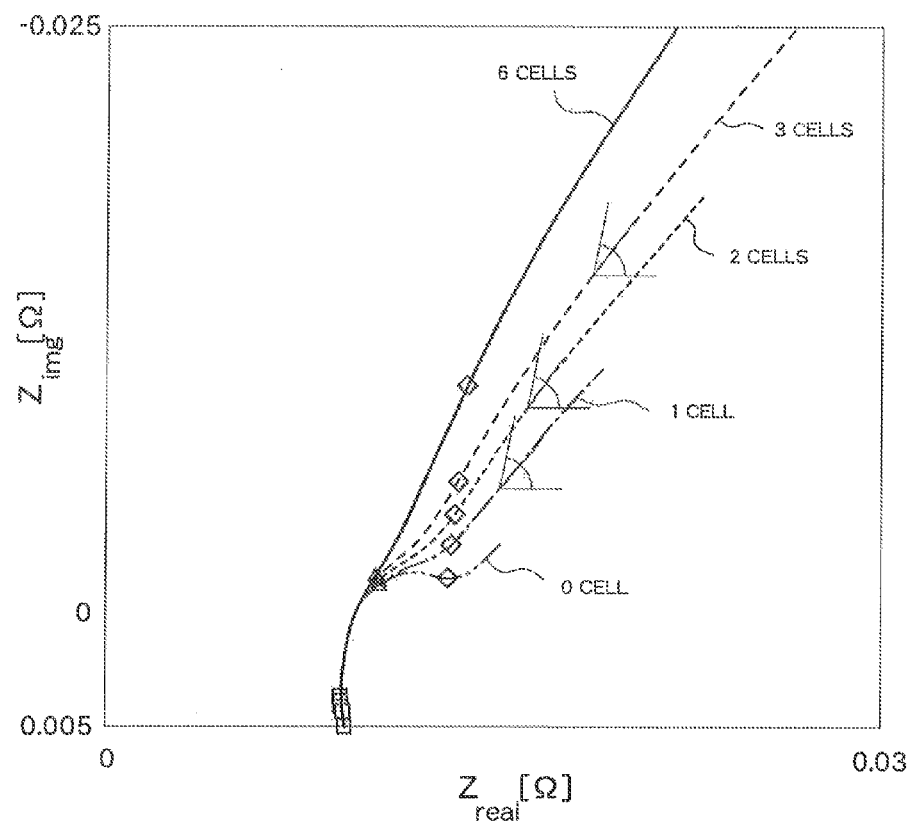
FIG. 6 It is a complex impedance chart (a Nyquist plot) acquired when a plurality of cells are connected in series.

FIG. 6 illustrates a complex impedance curve made by connecting complex impedances of a circuit equivalent to a case where a plurality of cells; for instance, six nickel-metal hydride cells, are connected in series and where an AC voltage or an AC current is applied to the cells. The drawing illustrates a complex impedance acquired when all of the six cells exhibit a normal capacity balance ("0 cell" in the drawing); a complex impedance acquired when one of the six cells exhibits an abnormal capacity balance ("one cell" in the drawing); a complex impedance acquired when two of the six cells exhibit an abnormal capacity balance ("two cells" in the drawing); a complex impedance acquired when three of the six cells exhibit an abnormal capacity balance ("three cells" in the drawing); and a complex impedance acquired when the six cells all exhibit an abnormal capacity balance ("six cells" in the drawing). When attention is focused on each of the slopes in the diffusion region, the slopes acquired in the case of the one cell, the two cells, the three cells, and the six cells are smaller than the slope acquired in the case of the 0 cell.

Figure 7:
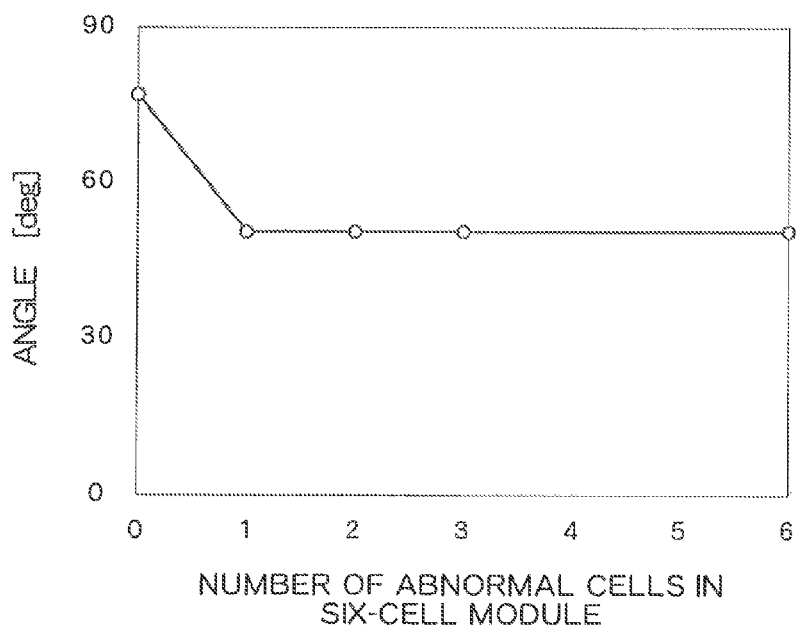
FIG. 7 It is a graph chart illustrating a relationship between the number of abnormal cells and a slope.

FIG. 7 illustrates a relationship between the number of abnormal cells and slopes in a diffusion region of a battery module produced by a series connection of six cells. A horizontal axis represents the number of cells with an abnormal capacity balance in the six cells, whilst a vertical axis represents a slope (degree) of the complex impedance in the diffusion region. If the battery module includes even one abnormal cell, the slope will become smaller when compared with the case where the battery module includes no abnormal cell. In this respect, if the battery module includes abnormal cells, the slope will become nearly constant regardless of the number of abnormal cells.

Consequently, even in the case of a plurality of cells, it is possible to detect whether or not an abnormal cell is included in the cells by use of a slope in the diffusion region. In the meantime, the larger the number of cells with an abnormal capacity balance becomes, the greater both a real-axis value and an imaginary-axis value become (see FIG. 6). Therefore, it is also possible to detect the number of cells with an abnormal capacity balance in the plurality of series-connected cells by means of a magnitude of the real-axis value or the imaginary-axis value.

A battery pack mounted in a hybrid automobile, and the like, is made up of a plurality of blocks (e.g., 10 blocks or more); each of the blocks further includes a plurality of modules (e.g., two modules); and each of the modules is formed from a plurality of cells (e.g., six to 12 cells). Consequently, when the battery pack mounted in an automobile is recovered and recycled, the battery pack is disassembled on a per-block basis or a per-module basis, and a slope in a diffusion region is detected on a per-block basis or a per-module basis. The thus-detected slope is then compared with a threshold value, thereby making it possible to determine whether or not at least one cell with an abnormal capacity balance is included in the block or the module and determine the battery pack to be normal or abnormal on a per-block basis or a per-module basis without disassembling the battery pack on a per-cell basis.

The fundamental principle of the embodiment is as mentioned above, and a configuration and processing specifics of the embodiment are hereunder described more specifically.

<First Embodiment>

Figure 8:
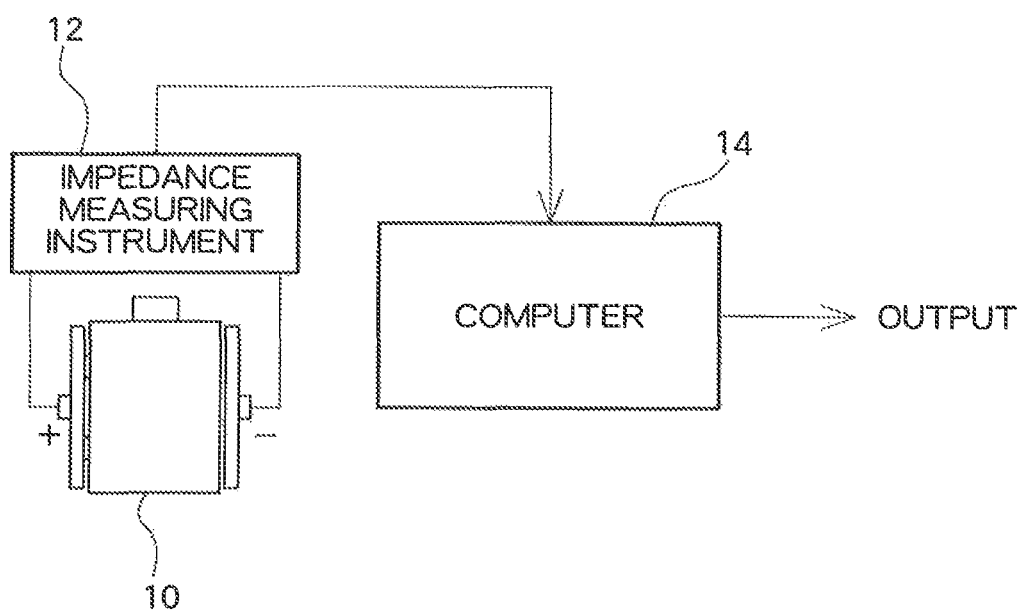
FIG. 8 It is a block diagram of a device of an embodiment.

FIG. 8 illustrates an entire configuration of a battery state detection device of the embodiment. The battery state detection device includes an impedance measuring instrument (or an impedance analyzer) 12 that is measurement means for measuring a complex impedance of a battery 10 by application of an AC voltage or an AC current to the battery 10 that is an objective of detection and a computer 14 that is supplied with data pertinent to the complex impedance in the diffusion region of the battery 10 measured by the impedance analyzer 12 and that calculates a slope in the diffusion region from the data pertinent to the complex impedance. The computer 14 additionally has memory that is storage means which stores a threshold value corresponding to a slope used for determining whether the battery 10 is normal or abnormal or a degree of deterioration of the battery. The computer 14 compares the thus-calculated slope in the diffusion region with a predetermined threshold value that is stored in the memory and that corresponds to the thus-calculated slope, thereby determining whether the battery is normal or abnormal or the degree of deterioration of the battery.

After discharging the battery 10 on predetermined conditions, the impedance measuring instrument 12 leaves the battery 10 at rest for a predetermined period of time; applies, at a point in time when electric potentials of both electrodes become substantially constant, AC voltages having two frequencies (which are 1 Hz or less; for instance, 0.1 Hz and 0.5 Hz) in the diffusion region to the battery 10; and measures resultant impedances of the battery 10. It is possible to set a measurement temperature to 25 degrees centigrade, an electric current to be applied to 500 mA, and an integral time to two seconds or thereabouts. In addition, required complex impedance data are data pertinent to complex impedances acquired at two frequencies in the diffusion region. The impedance measuring instrument 12 is by no means limited to the measurement mentioned above but can also measure complex impedances at respective frequencies while sequentially changing the frequency of the AC voltage to be applied in a range from 1 MHz to 0.1 Hz. In this regard, the frequency of the diffusion region varies according to a type or temperature of a rechargeable battery, and hence the essential requirement is to set, as appropriate, a value of a frequency to be measured on various conditions.

The computer 14 is equipped with a CPU, memory, and an I/O interface. The CPU computes a slope in a diffusion region; in other words, a slope of a straight line that connects together complex impedances measured at two frequencies in the diffusion region on a two dimensional plane defined by a real-axis component and an imaginary-axis component, such as those illustrated in FIG. 2 and FIG. 4. Memory stores, as a threshold value, a slope preliminarily measured from a battery which exhibits a normal capacity balance. The CPU compares the threshold value stored in the memory with the thus-computed slope, thereby determining whether or not the thus-computed slope is smaller than the threshold value. When the thus-calculated slope is nearly equal to the threshold value, the battery 10 is determined to be normal. On the contrary, when the calculated slope is smaller than the threshold value, the battery 10 is determined to be an abnormal battery; in other words, a battery which exhibits an unbalanced capacity as a result of the progress of deterioration, and a determination result is output. The computer 14 also has a display, and the determination result can also be displayed on the display.

Figure 9:
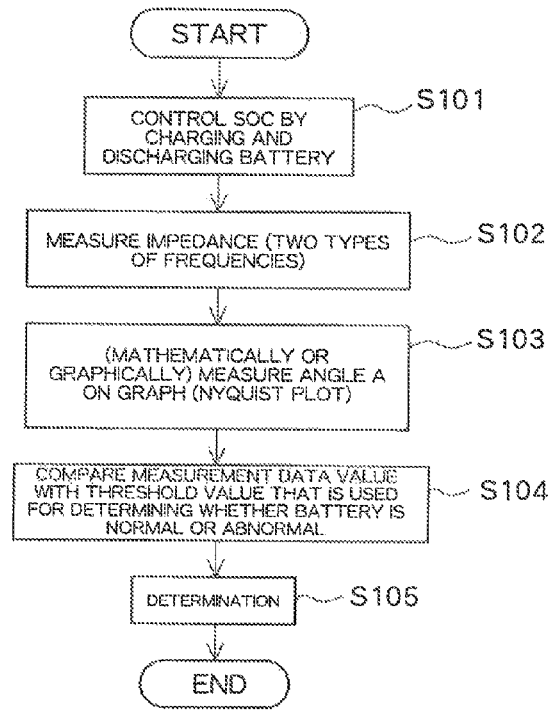
FIG. 9 It is a processing flowchart of a first embodiment.

FIG. 9 illustrates a processing flowchart of the embodiment. First, a state of charge (SOC) is controlled by charging and discharging the battery 10 that is a target of detection (S101). To be specific, the battery 10 is discharged until the SOC comes to 0% or thereabouts. The expression "0% or thereabouts" means a case where the SOC is 0% and a nominal charge state that can be deemed to be substantially 0%; namely, 0% to about 5%. By means of the control, a capacity of a positive electrode comes to 0 Ah if the battery is normal, and a capacity of a negative electrode is reserved (a discharge reserve is positive). However, if the battery is abnormal, the capacity of the negative electrode will come to 0 Ah (the discharge reserve is negative).

Next, measurement electrodes are connected to the battery 10, and the impedance measuring instrument 12 measures complex impedances of the battery 10 by application of an AC voltage (S102). A frequency of the AC voltage to be applied to the battery 10 is at least two frequencies in the diffusion region; for instance, 0.1 Hz and 0.5 Hz. The frequencies; however, are not limited to them. In general, arbitrary two frequencies that are 1 Hz or less are available.

The computer 14 then calculates a slope in the diffusion region; namely, a slope of a graph (a Nyquist plot) in FIG. 4 or the like, by use of the data pertinent to the complex impedances at two frequencies measured by the impedance measuring instrument 12 (S103). The slope can also be computed by either a mathematical or graphical (geometrical) method. Alternatively, provided that a complex impedance measured at a relatively higher one of two frequencies is taken as a first complex impedance and that a complex impedance measured at a relatively lower frequency is taken as a second complex impedance, a slope of a straight line that connects the first complex impedance to the second complex impedance is calculated.

The computer 14 next compares a threshold value (a determination threshold value used for determining whether the battery is normal or abnormal or the degree of deterioration of the battery) with the calculated slope (S104), thereby determining whether the battery is normal or abnormal or the degree of deterioration of the battery from a comparison result (S105). Specifically, when the calculated slope is smaller than the threshold value, the battery is determined to be abnormal or deteriorated. Otherwise, the battery is determined to be normal. As a matter of course, a permissible margin can also be set on the threshold value. The battery can also be determined to be abnormal or deteriorated only when the slope is in excess of the permissible margin and smaller than the threshold value.

Figure 10:
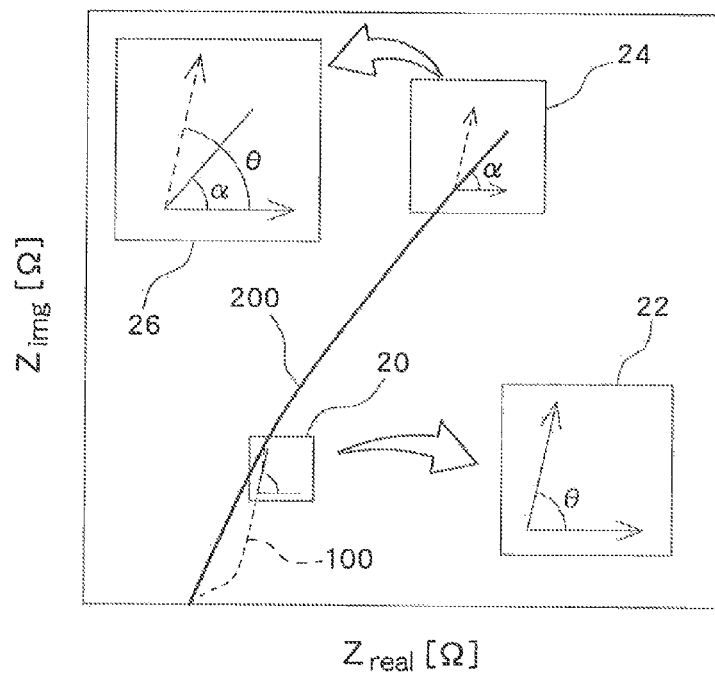
FIG. 10 It is a schematic explanatory chart (a Nyquist plot) of the first embodiment.

FIG. 10 schematically illustrates processing of the embodiment. Illustrated are complex impedance curves on the two-dimensional plane defined by the horizontal axis representing the real-axis component Zreal and the vertical axis representing the imaginary-axis component Zimg; reference numeral 100 denotes a complex impedance curve of a normal battery; and reference numeral 200 denotes a complex impedance curve of an abnormal battery. Of the complex impedances of the normal battery, two complex impedances of different frequencies in the diffusion region are connected together to thus form a straight line, and a slope of the straight line is defined as θ. In the diffusion region, a region where there are two complex impedances of different frequencies is taken as a region 20. A region 22 corresponds to an enlargement of the region 20. In the meantime, of the complex impedances of the abnormal battery, two complex impedances of different frequencies in the diffusion region are connected together to thus form a straight line, and a slope of the straight line is taken as α. In the diffusion region, a region where there are two complex impedances of different frequencies is taken as a region 24. A region 26 corresponds to an enlargement of the region 24. When the slope α and the slope θ are compared with each other, a relationship of α<θ stands as illustrated in the region 26. The computer 14 determines whether or not the relationship of α<θ stands, thereby uniquely determining whether the battery 10 is normal or abnormal.

Figure 11:
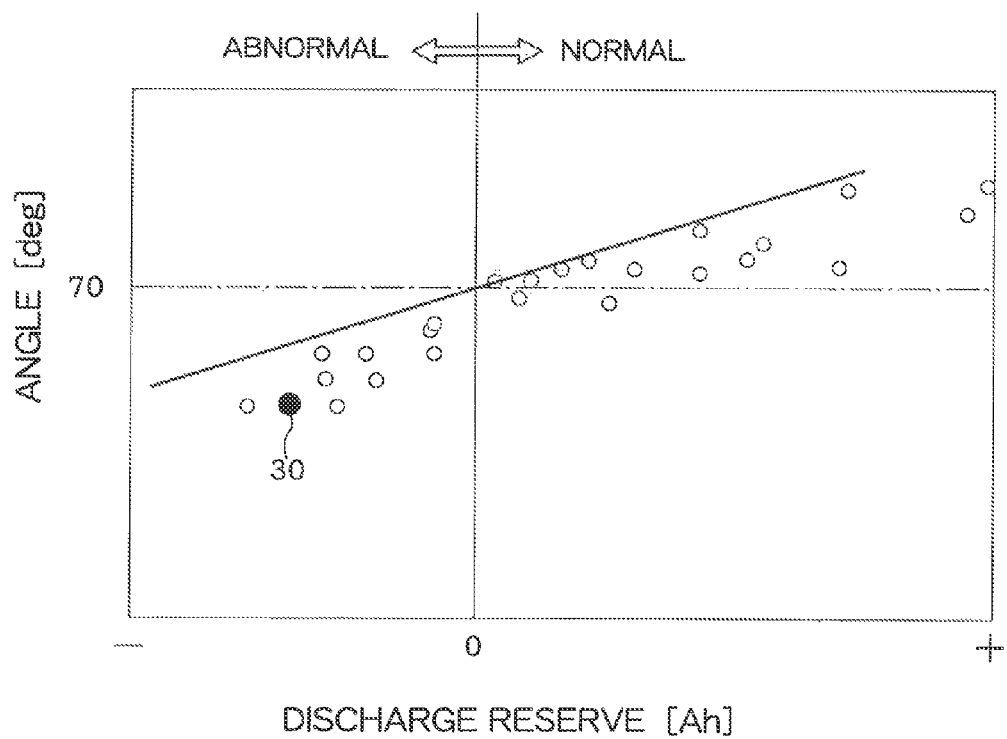
FIG. 11 It is a graph chart illustrating a relationship between a discharge reserve and a slope.

FIG. 11 illustrates a relationship of a discharge reserve and a slope. When the discharge reserve is positive, the battery has a normal capacity balance. When the discharge reserve is negative, the battery has an abnormal capacity balance. A positive correlation exists between the discharge reserve and the slope in the diffusion region, and the slope increases with an increasing discharge reserve. Accordingly, data pertinent to the discharge reserve and the slope are collected from a plurality of batteries, and an angle which a straight line made by collinear approximation of the data forms with a straight line of the discharge reserve 0 Ah is set as a threshold value. In the drawing, the threshold value is set to; for instance, 70 degrees. The threshold value is preliminarily stored in the memory of the computer 14. Provided that the slope of the battery 10 to be detected is an angle denoted by a point 30 in the drawing; for instance, 60 degrees, the discharge reserve will be negative because the angle is smaller than 70 degrees that is the threshold value. To be specific, the battery can be determined to be one with an abnormal capacity balance.

In the embodiment, in order to prevent the battery from being determined to be normal despite its abnormal capacity balance, the straight line to be taken as the threshold value is set on an upper side of the plot defined by the discharge reserve and the plot. Further, in the embodiment, the battery 10 is discharged until its SOC comes to 0% or thereabouts. The reason for this is that, since a slope becomes greater at a lower SOC level, a determination as to whether the capacity balance is normal or abnormal can be made with superior accuracy. However, the SOC achieved after discharging of the battery shall not be limited to 0% or thereabouts. For instance, when the SOC is 20% or less, variations in slope are preferably large enough. 20% SOC or more is naturally taken as being preferable. Moreover, in the first embodiment, a battery (see FIG. 3) that exhibits a negative discharge reserve (negative electrode regulation) is taken as an example of a battery with an unbalanced capacity; however, an unbalanced capacity can be appropriately detected even from a battery determined to be unbalanced in another embodiment.

<Second Embodiment>

In the first embodiment, a slope of the straight line that connects together two complex impedances of different frequencies in the diffusion region is computed, and a determination is made, by use of the thus-computed slope, as to whether the battery is normal or abnormal or the degree of deterioration of the battery. However, a determination can also be made as to whether the battery 10 is normal or abnormal or the degree of deterioration of the battery, by use of a slope of a straight line that connects a reference complex impedance that is a complex impedance in the diffusion region of a base battery, which is to serve as a reference during comparison of the battery 10, with a complex impedance of the same frequency as that of the reference complex impedance in the diffusion region of the battery 10. An embodiment for this case is hereunder described. In place of the measurement means of the first embodiment, the impedance measuring instrument (or the impedance analyzer) 12 serving as measurement means measures a complex impedance of the same frequency as that of the reference complex impedance in the diffusion region of the battery 10. In place of the detection means of the first embodiment, the computer 14 serving as detection means calculates a distance between the reference complex impedance and the complex impedance measured by the measurement means, and also calculates a slope of a straight line that connects the reference complex impedance to the complex impedance measured by the measurement means or a slope of an approximate straight line. Further, in place of the storage means of the first embodiment, the memory serving as the storage means preliminarily stores a threshold value corresponding to the distance and another threshold value corresponding to the slope. In place of the detection means of the first embodiment, detecting whether the battery 10 is normal or abnormal or the degree of deterioration of the battery 10 is performed by use of the thus-calculated distance and slope and the threshold value corresponding to the distance and the threshold value corresponding to the slope which are stored in the memory.

Figure 12:
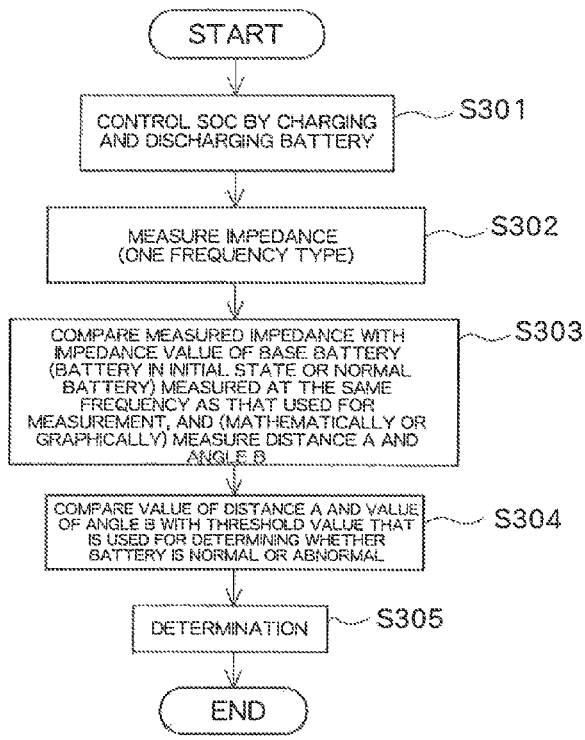
FIG. 12 It is a processing flowchart of a third embodiment.

FIG. 12 illustrates a processing flowchart of the embodiment. First, the battery 10 to be detected is charged and discharged, to thereby control its SOC (S301). Specifically, the battery 10 is discharged until its SOC comes to 0% or thereabouts.

Next, the measurement electrodes are connected to the battery 10, and the impedance measuring instrument 12 measures complex impedances of the battery 10 by application of the AC voltage to the battery (S302). A frequency of the AC voltage to be applied to the battery 10 is one frequency in the diffusion region; for instance, 0.1 Hz. The frequency; however, is not limited to this value.

The computer 14 next reads from the memory, among reference complex impedances that are complex impedances in the diffusion region of the base battery which is to serve as a reference during comparison of the battery 10, a reference complex impedance which has the same frequency as the measured frequency and which is acquired when the SOC assumes a value of 0%. The base battery herein refers to; for instance, the battery 10 in the initial state or a battery that differs from the battery 10 but is known to be normal. A straight line is drawn between the complex impedance acquired in S302 and the reference complex impedance read from the memory, and a slope of the straight line and a distance between the complex impedances are computed (S303). The slope and the distance can also be computed by means of either a mathematical or graphical (geometrical) method. In relation to the reference complex impedance, a complex impedance acquired when the SOC is 0% is measured by preliminarily applying an AC voltage of the same frequency as the measurement frequency in the initial state (a normal state) of the battery 10 before detection of the battery 10, or a complex impedance acquired when the SOC is 0% is measured by preliminarily applying the AC voltage of the same frequency to another normal battery that differs from the battery 10, and either of the thus-measured complex impedances is stored in the memory. The reference complex impedance of the base battery and the complex impedance of the battery 10 to be detected are impedances to be measured on the same conditions concerning the SOC and the frequency. Although the complex impedance can change according to an SOC and a frequency, a complex impedance reflecting a degree of deterioration is extracted by making conditions concerning the SOC and the frequency identical with each other.

The computer 14 next compares the threshold value (a determination threshold value used for determining whether the battery is normal or abnormal or the degree of deterioration of the battery) preliminarily stored in the memory with the slope and the distance obtained by computation (S304), and determines whether the battery is normal or abnormal or the degree of deterioration of the battery, from the comparison result (S305). To be specific, when the distance and the angle fall within specific areas on the two-dimensional plane defined by the distance and the angle, the battery is determined to be normal. Otherwise, the battery is determined to be abnormal or deteriorated.

Figure 13:
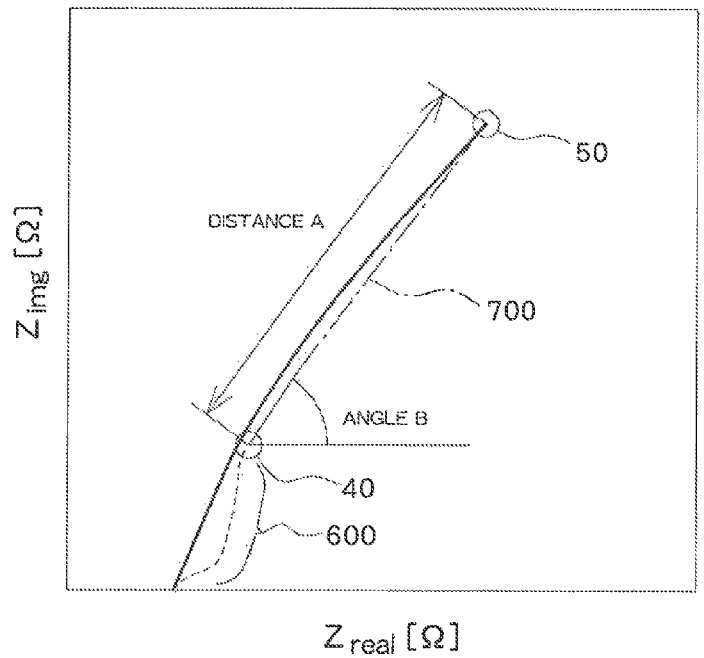
FIG. 13 It is a schematic explanatory chart (a Nyquist plot) of the third embodiment.

FIG. 13 schematically illustrates processing of the embodiment. In the drawing, reference numeral 600 designates a complex impedance curve in an initial state or a complex impedance curve of another normal battery that differs from the battery 10; in other words, a complex impedance curve of the base battery. Reference numeral 700 designates a complex impedance curve obtained when the battery 10 assumes 0% SOC. In addition, point 40 denotes a complex impedance of the battery 10 in it is initial state at a certain frequency; for instance, 0.1 Hz, or a complex impedance of another normal battery at the same frequency. Point 50 denotes a complex impedance of the battery 10 at the same frequency (0.1 Hz) during detection of the battery 10. The computer 14 computes a slope B of a straight line that connects the point 40 to the point 50 and a distance A between the points 40 and 50.

Figure 14:
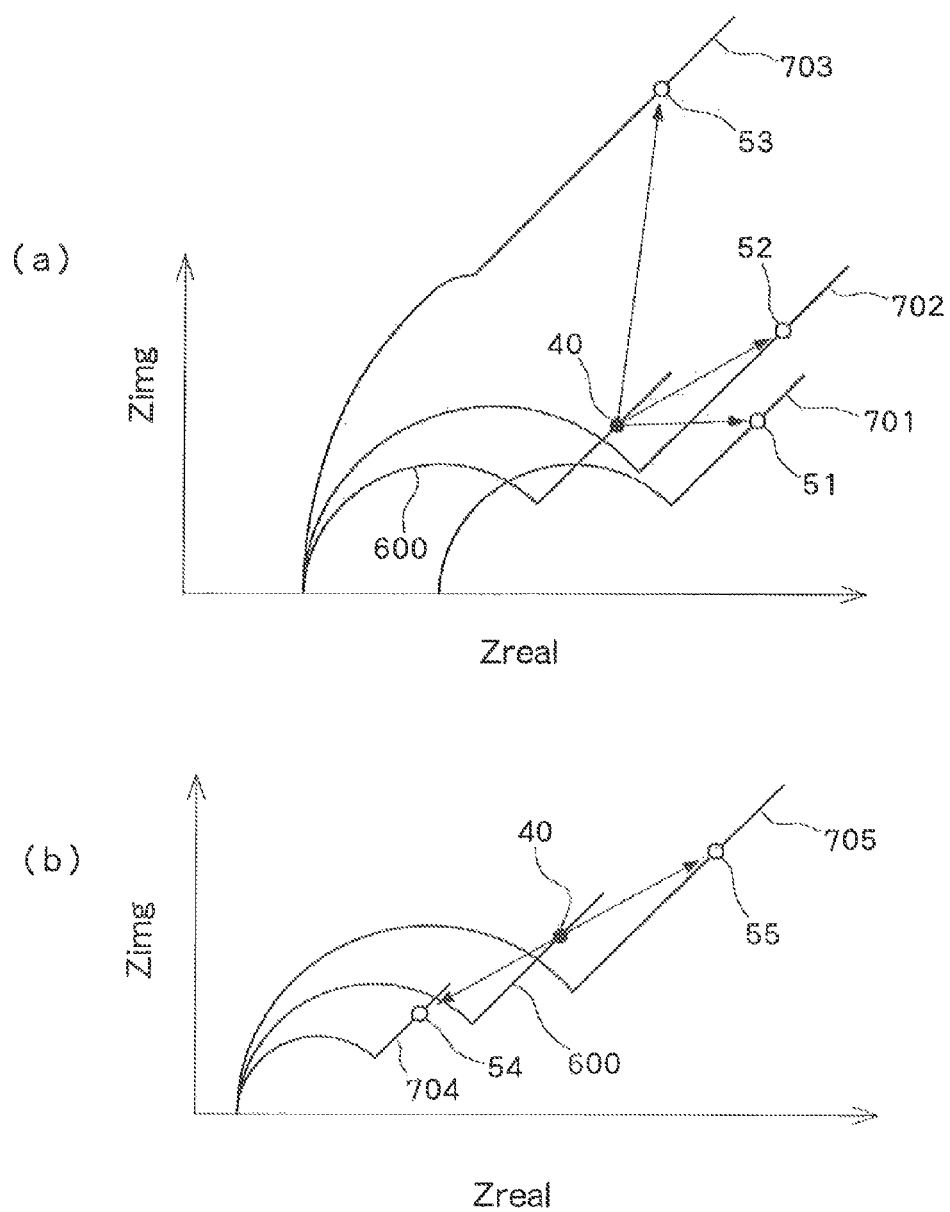
FIG. 14 They are charts (Nyquist plots) illustrating changes in complex impedances which appear in an identical state of charge (SOC) and in different states of charge.

FIG. 14 illustrates changes occurred in complex impedances at the same frequency when the state of charge of the base battery and the state of charge (SOC) of the battery 10 are identical with each other and when they differ from each other. FIG. 14(a) illustrates a change occurred in a complex impedance when the SOCs are identical with each other, and FIG. 14(b) illustrates a change occurred in a complex impedance when the SOCs differ from each other. In FIG. 14(a), reference numeral 600 designates a complex impedance curve of the base battery; namely, a complex impedance curve of the battery 10 in an initial state or a complex impedance curve of anther normal battery. Point 40 denotes a complex impedance at a certain frequency; for instance, 0.1 Hz, in the diffusion region. Reference numerals 701, 702, and 703 designate complex impedance curves when the battery 10 to be detected are in various deteriorated states. Points 51, 52, and 53 denote complex impedances at the same frequency; for instance, 0.1 Hz, in the diffusion region. There are a straight line connecting the point 40 to the point 51, a straight line connecting the point 40 to the point 52, and another straight line connecting the point 40 to the point 53, and each of the straight lines has its own distance and slope. In the case where the batteries exhibit an identical SOC, the point 51, the point 52, and the point 53 are present in the same direction along both the real-axis direction and the imaginary-axis direction with reference to the point 40, and slopes of the respective straight lines fall in a range from 0 degree to 90 degrees. The distances and the angles variously change in the angle range according to the degree of deterioration of the battery 10. For instance, when the distance assumes a given value or more, the battery is determined to be abnormal. Conceivable reasons for the abnormality include an unbalanced capacity, a reduction in liquid electrolyte, deterioration of an active material, and the like. Processing described in connection with the embodiment utilizes the changes illustrated in FIG. 14(a).

In the meantime, FIG. 14(b) illustrates a case where the base battery and the battery 10 differ from each other in terms of the SOC. Reference numerals 704 and 705 designate complex impedance curves of the battery 10 to be detected in various states of deterioration, and points 54 and 55 denote complex impedances measured at the same frequency; for instance, 0.1 Hz, in the diffusion region. A straight line connecting the point 40 to the point 54 and another straight line connecting the point 40 to the point 55 are respectively present, and each of the straight lines has a distance and a slope. When the batteries differ from each other in terms of the SOC, there can be a case where the complex impedance decreases with respect to the point 40 as in the case with the point 54 as well as a case where the complex impedance increases with respect to the point 40 as in the case with the point 55. At this time, the slope falls in a range from 180 degrees to 270 degrees rather than a range from 0 degrees to 90 degrees. Basically, the base battery and the battery 10 are compared with each other at an identical SOC. However, even when a slight difference exists between the base battery and the battery 10 in terms of the SOC, a determination can be made as to whether the battery 10 is normal or abnormal by taking the changes illustrated in FIG. 14 (b) into account. Specifically, when the batteries are identical with each other in terms of the SOC, the slopes fall in the range from 0 degrees to 90 degrees. On the contrary, when the batteries are slightly different from each other in terms of the SOC, there can be a case where the slope falls in a range from 180 degrees to 270 degrees. Therefore, the battery is determined to be normal when a predetermined condition is met even in the case where the slope falls in the range from 180 degrees to 270 degrees.

Figure 15:
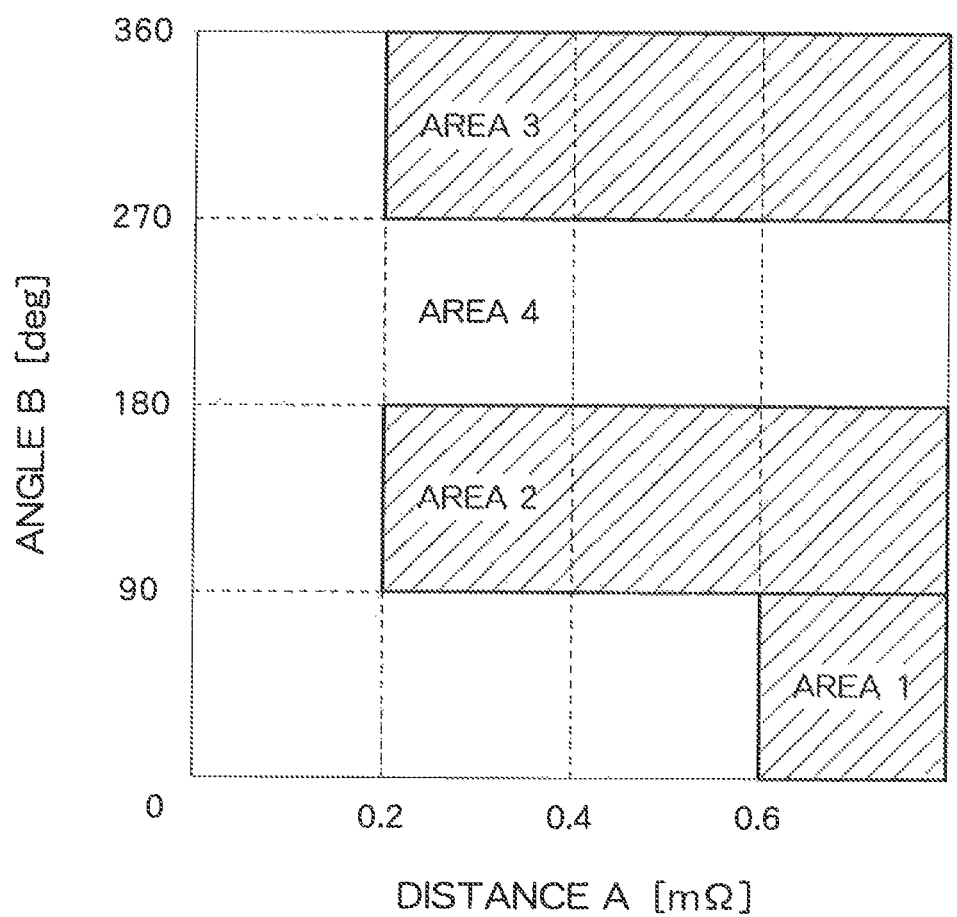
FIG. 15 It is a chart showing a slope, a distance, and normal and abnormal areas.

FIG. 15 illustrates example normal areas and example abnormal areas on the two-dimensional plane defined by the distance and the slope. The chart is a map of threshold values preliminarily stored in the memory of the computer 14. In the chart, areas 1, 2, and 3 with hatched lines are areas in which the battery is determined to be abnormal, and a remaining area 4 is an area in which the battery is determined to be normal. Specifically, the area 1 is defined by a distance of 0.6 mΩ or more and a slope ranging from 0 degree to 90 degrees. Abnormality pertinent to this area is attributable to an increase in resistance. The area 2 is defined by a distance of 0.2 mΩ or more and a slope ranging from 90 degrees to 180 degrees. Abnormality pertinent to this area is attributable to a deterioration in battery performance caused by a change in marginal capacity. The area 3 is defined by a distance of 0.2 mΩ or more and a slope ranging from 270 degrees to 360 degrees. Abnormality pertinent to this area is attributable to a deterioration in battery performance caused by an increase in component or solution resistance. The area 4 is an area in which the battery is determined to be normal. To be specific, the area is defined by a distance of less than 0.6 mΩ and the slope ranging from 0 degree to 90 degrees, the slope ranging from 180 degrees to 270 degrees regardless of the distance, and the distance of less than 0.2 mΩ and the slope ranging from 270 degrees to 360 degrees. In principle, the above can be summarized as follows; when the slope falls in the range from 90 degrees to 180 degrees and the range from 270 degrees to 360 degrees, the battery is determined to be abnormal. Otherwise, the battery is determined to be normal. Even when the slope falls in the range from 0 degree to 90 degrees, the battery is determined to be abnormal if the distance is large. More specifically, the battery is determined to be abnormal when the slope falls in the range from 0 degree to 90 degrees and when the distance assumes a certain value or more (0.6 Ω in the embodiment, and the value is referred to as a first value); when the slope falls in the range from 90 degrees to 180 degrees and when the distance assumes a second value (0.2 Ω in the embodiment) or more that is smaller than the first value; and when the slope falls in the range from 270 degrees to 360 degrees and when the distance assumes the second value or more. Otherwise, the battery can be determined to be normal.

When the distance and the angle acquired in S303 fall in; for instance, the area 1, the computer 14 determines the battery 10 as being abnormal, outputting the determination result. In the meantime, when the distance and the angle acquired in S303 fall in the area 4, the computer 14 determines the battery 10 as being normal, outputting the determination result. In the embodiment, the battery 10 is discharged until its SOC comes to 0% or thereabouts. The reason for this is that, since larger variations occur in distance and angle as the SOC becomes lower, a determination can be made accurately as to whether the battery is normal or abnormal. In this respect, the SOC achieved after discharge shall not be limited to 0% or thereabouts. For instance, the SOC is 20% or less, variations in distance and angle are preferably large enough. 20% SOC or more is naturally taken as being preferable.

Moreover, in the embodiment, the battery 10 in its initial state or a battery that is different from the battery 10 but know to be normal is used as the base battery.

However, any battery other than these batteries can be used, so long as it can serve as a reference when compared with the battery 10 to be detected. Any battery is available if a state of the battery is known with regard to at least; for instance, an item (SOC, or the like) used for comparison with the battery 10 to be detected.

As descried in connection with the embodiments, it is possible to detect if the battery 10 is normal or abnormal by use of the slope of the straight line between complex impedances at two frequencies in the diffusion region in the embodiments. In addition, it is also possible to detect if the battery 10 is normal or abnormal by use of the slope of the straight line connecting the complex impedances at the same frequency in the diffusion region and the distance between the complex impedances. When the battery pack mounted in the automobile is taken out of the vehicle body and recycled, detecting whether blocks or modules that make up the battery pack are normal or abnormal is necessary. Accordingly, it is possible to detect with high accuracy whether the battery is normal or abnormal on a per-block or per-module basis, by use of the device and the method descried in connection with the embodiments, so that a factor of recycling of the battery is enhanced. Under the device and the method described in connection with the embodiments, detecting whether the battery is normal or abnormal can be performed in a nondestructive manner at an ambient temperature (25 degrees centigrade). In particular, as illustrated in FIG. 6 or FIG. 7, when a plurality of cells are connected in series and even when at least one cell is abnormal, the cell can be detected without fail. Therefore, detecting if a battery is normal or abnormal can be reliably performed in modules that are made up of a plurality of cells or in blocks that are made up of a plurality of modules.

The conditions for detection and the states of detection described in connection with the respective embodiments are summarized as follows.

<First Embodiment>

Frequency condition: two different frequencies in a diffusion region

State of charge (SOC) condition: an identical state of charge (0 or thereabouts in the first embodiment)

Item to be detected: a slope

State of detection: whether a capacity balance is normal or abnormal (when a plurality of cells are connected in series, the number of cells with an abnormal capacity balance can also be detected by detection of the real-axis value and the imaginary-axis value)

<Second Embodiment>

Frequency condition: one frequency in the diffusion region

State of charge condition: 0 or thereabouts in the second embodiment

Reference complex impedance: a complex impedance of a battery in an initial state or a complex impedance of another normal battery (preliminarily stored in memory)

Items to be detected: a slope and a distance

State of detection: whether a capacity balance is normal or abnormal

In the first embodiment, the impedance measuring instrument 12 measures two complex impedances of different frequencies in the diffusion region of the battery 10. However, if a complex impedance of a certain frequency in the diffusion region of the battery 10 is preliminarily known and stored in the memory in advance, the impedance measuring instrument 12 can perform processing for measuring one complex impedance of another frequency, which differs from the certain frequency, in the diffusion region of the battery 10. Specifically, in the first embodiment, the impedance measuring instrument 12 does not necessarily need to measure complex impedances of two different frequencies. Therefore, changes can also be made to; for instance, the flowchart illustrated in FIG. 9, as follows: A determination can be made, prior to processing pertinent to S102, as to whether or not a certain complex impedance of a frequency in the diffusion region of the battery 10 is already stored in the memory. If not, there will be performed a transition to processing pertinent to S102. On the other hand, if the complex impedance is stored, a change can be made to processing such that only a complex impedance is measured at another frequency through processing pertinent to S102. In the second embodiment, since the reference complex impedance is preliminarily stored in the memory prior to measurement of the battery 10, the impedance measuring device 12 does not need to perform measurement.

In the first embodiment, the slope of the straight line that connects two complex impedances of different frequencies in the diffusion region of the battery 10 is computed. However, a slope of a straight line or an approximate straight line that connects three or more complex impedances of different frequencies in the diffusion region of the battery 10 can also be computed.

A Warburg impedance and a transmission-line-model impedance are known as complex impedances in the diffusion region of the battery. In the embodiment, detecting whether the battery is normal or abnormal is performed by use of the Warburg impedance. However, detecting whether or not the battery is normal or abnormal can also be performed by use of a transmission-line-model impedance. The Warburg impedance is a known impedance relevant to hydrogen diffusion and disclosed in; for instance, Kuriyama, N., et al.: J Alloy & Compd., 202 (1993), 183 Zhang, W., et al.: Electrochem. Soc. the 185$^{th}$ Meet., (1994), abstr. No. 593

Figure 16:
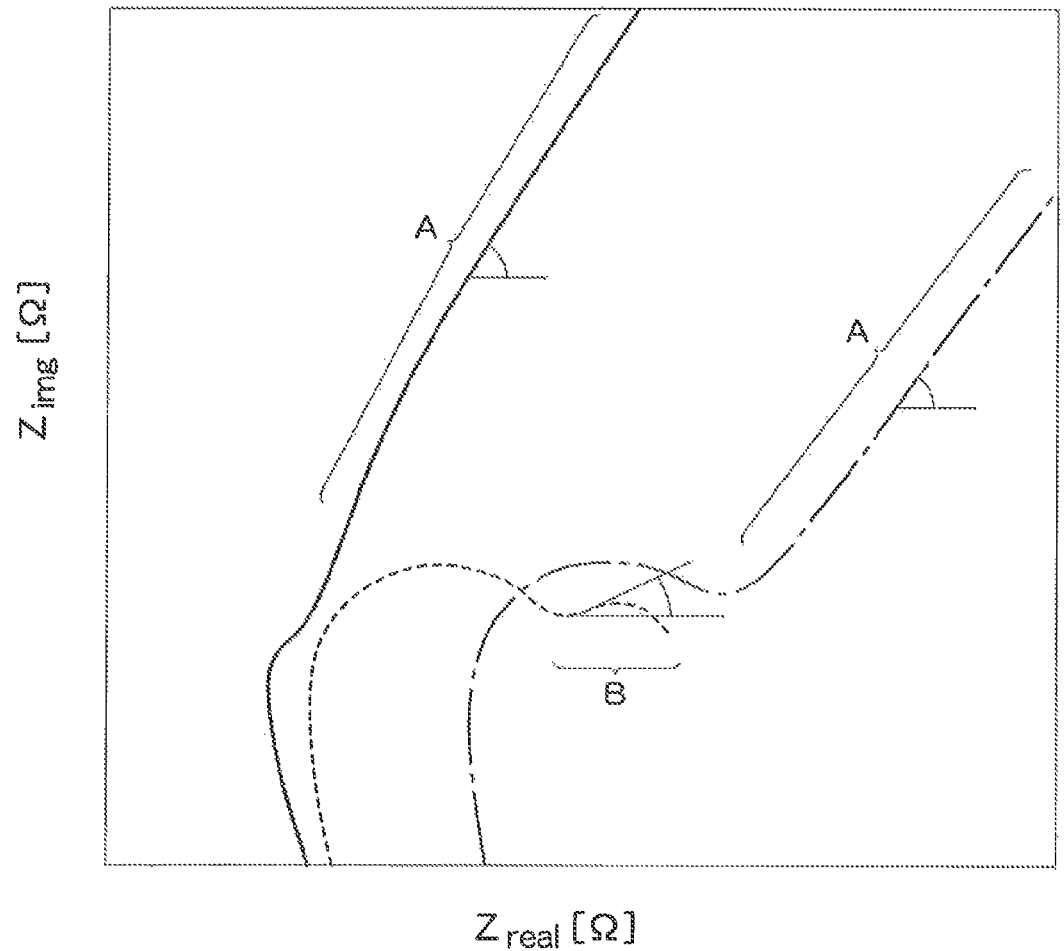
FIG. 16 It is a chart (a Nyquist plot) illustrating a Warburg impedance and an impedance of a transmission line model.

FIG. 16 illustrates a Warburg impedance and a transmission-line-model impedance. In the drawing, regions A correspond to a Warburg impedance, and a region B corresponds to a transmission-line-model impedance. When an explanation is given with reference to the first embodiment, a slope of a straight line that connects two transmission-line-model impedances of different frequencies is computed, and the thus-computed slope is compared with a threshold value, thereby detecting whether the battery 10 is normal or abnormal.

In addition, in the embodiment, the slope is computed by plotting complex impedances as a Nyquist plot. However, a Bode diagram can also be used. Moreover, in the embodiment, an AC voltage is applied to measure complex impedances, but a minimum requirement is application of an AC signal. Hence; for instance, an AC current, can also be applied.

In the first embodiment, a slope of a straight line that connects two complex impedances of different frequencies is computed by use of the two-dimensional plane that adopts as axes a real-axis component and an imaginary-axis component. However, the way to compute the slope is not limited to the way mentioned above. The slope can also be computed by use of a three-dimensional plane that includes as axes the real-axis component and the imaginary-axis component. Alternatively, a slope can be computed by use of a Bode diagram that employs a frequency and a magnitude of a complex impedance as axes and another Bode diagram that employs a frequency and a phase as axes.

Moreover, in the second embodiment, a distance between the reference complex impedance and the complex impedance measured by the measurement means is detected by use of the two-dimensional plane that employs the real-axis component and the imaginary-axis component as axes. Further, a slope of a straight line that connects the reference complex impedance to the complex impedance measured by the measurement means is detected. However, the way to detect the distance and the slope is not limited to that mentioned above. A distance and a slope can also be computed by use of a three-dimensional plane that adopts the real-axis component and the imaginary-axis component as axes. Alternatively, a distance and a slope can also be computed by use of a Bode diagram that employs a frequency and a magnitude of a complex impedance as axes and another Bode diagram that employs a frequency and a phase as axes.

<Third Embodiment>

Figure 17:
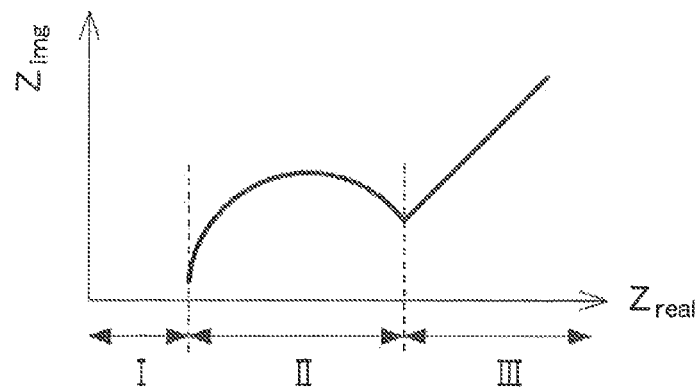
FIG. 17 It is a complex impedance chart (a Nyquist plot).

FIG. 17 illustrates a chart (a Nyquist plot: a right side of a horizontal axis is a positive side; a left side of the horizontal axis is a negative side; an upper side of a vertical axis is a negative side; a lower side of the vertical axis is a positive side; and the same also applies to the other Nyquist plots) in which a pair of data sets including a real-axis component and an imaginary-axis component of a complex impedance is plotted on a two-dimensional plane whose horizontal axis represents a real-axis component Zreal and whose vertical axis represents an imaginary-axis component Zimg. The complex impedance can be roughly divided into a charge transfer resistance region II that is on a high frequency side and that assumes a circular-arc shape; a diffusion resistance region III that is on a low frequency side and that assumes a shape of a nearly straight line; and a component-solution resistance region I. The diffusion resistance region III is a region which is formed from an impedance contributed to mass diffusion and in which a frequency is about 1 Hz or less. The applicants of the present patent application found that a significant difference occurs between a complex impedance of a battery with a normal capacity balance (FIG. 1) and a battery with an abnormal capacity balance (FIG. 3), in the diffusion resistance region. In this regard, in the present embodiment, a magnitude |Z| of the complex impedance, a magnitude |Zreal| of the real-axis component, and a magnitude |Zimg| of the imaginary-axis component represent absolute values of the respective components.

Figure 18:
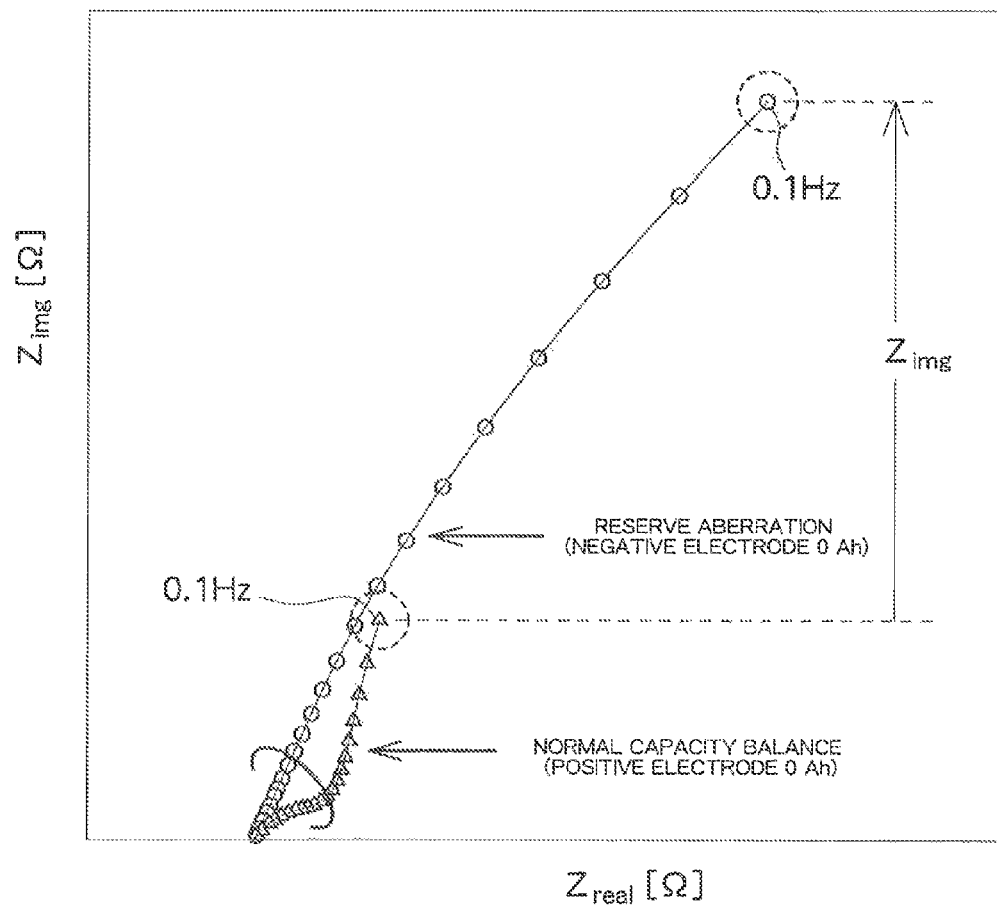
FIG. 18 It is a complex impedance chart (a Nyquist plot) of a normal capacity balance and an abnormal capacity balance of a battery.

FIG. 18 illustrates a change in complex impedance of a battery with a normal capacity balance and a change in complex impedance of a battery with an abnormal capacity balance in the diffusion resistance region. The battery with a normal capacity balance is one in which the capacity of the positive electrode assumes a value of 0 during an electrical discharge. Meanwhile, the battery with an abnormal capacity balance is one in which the capacity of the negative electrode assumes a value of 0 (deviation of a reserve) during the electrical discharge. When attention is focused on a complex impedance of a frequency of 0.1 Hz, the complex impedance of the battery with an abnormal capacity balance is remarkably increased when compared with the battery with the normal capacity balance, in terms of the magnitude of the real-axis component and the magnitude of the imaginary-axis component. In the chart, attention is particularly paid to the imaginary-axis component of the complex impedance, and that chart illustrates that the imaginary-axis component Zimg of the battery with an abnormal capacity balance has greatly changed toward the negative side when compared with the case of the battery with the normal capacity balance. Accordingly, attention is paid to the magnitude of the imaginary-axis component of the complex impedance in the diffusion resistance region (for instance, 0.1 Hz), and the magnitude is compared with a threshold value, thereby enabling distinction between the battery with the normal capacity balance and the battery with the abnormal capacity balance.

In the meantime; for instance, a vehicle-mounted battery is made up of a module which includes a plurality of series-connected cells; hence, it is necessary to identify, on a per-module basis, whether the capacity balance is normal or abnormal. Specifically, a battery pack mounted in a hybrid automobile, or the like, is made up of a plurality of blocks (e.g., 10 blocks or more). Each of the blocks is further made up of a plurality of modules (e.g., two modules). In addition, each of the modules is formed from a plurality of cells (for instance, 6 to 12 cells). Accordingly, when the battery pack mounted in the automobile is recovered and recycled, it is expected that the battery pack can be disassembled into blocks or modules; that a determination can be made, on a per-block or per-module basis, as to whether or not at least one cell with an abnormal capacity balance is included; and that the battery can be sorted into an abnormal battery and a normal battery on a per-block basis or a per-module basis without being disassembled into cells.

Figure 19:
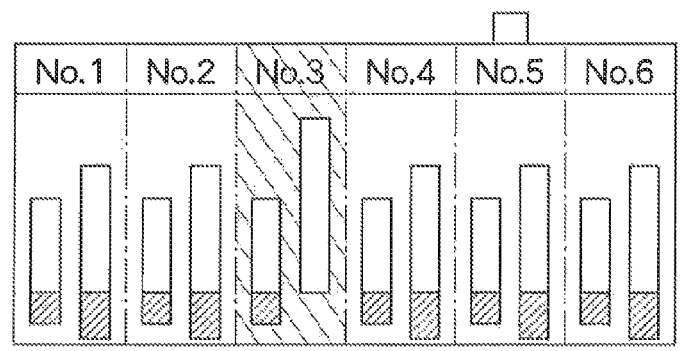
FIG. 19 It is an explanatory view of a module made up of six cells.

FIG. 19 illustrates a configuration of a module made up of; e.g., six series-connected cells, as a plurality of cells. Six cells are numbered from No. 1 to No. 6. The cells No. 1, No. 2, No. 4, No. 5, and No. 6 exhibit a normal capacity balance, whilst only the cell No. 3 exhibits an abnormal capacity balance.

Figure 20:
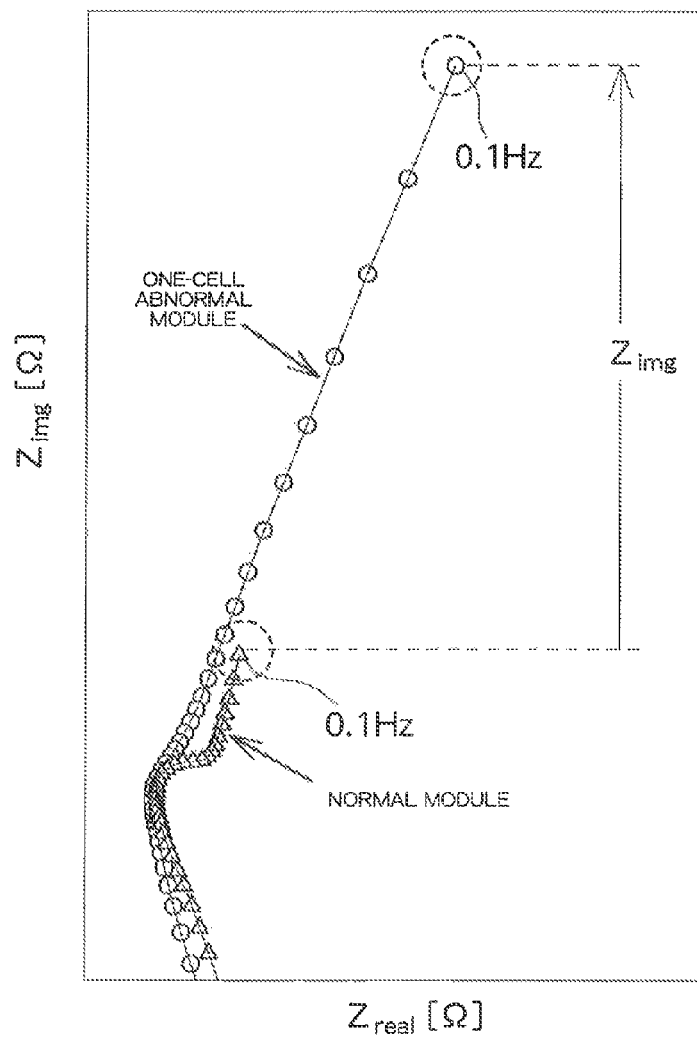
FIG. 20 It is a complex impedance chart (a Nyquist plot) of a normal module and an abnormal module.

FIG. 20 illustrates a complex impedance of a module in which six cells all exhibit a normal capacity balance and a complex impedance of a module in which only the cell No. 3 of six cells exhibits an abnormal capacity balance. When attention is paid to the imaginary-axis component Zimg of the complex impedance of a frequency of 0.1 Hz in the diffusion resistance region, a value of the imaginary-axis component of the abnormal module has greatly changed when compared with a value of the imaginary-axis component of the normal module. Specifically, since the upper side of the vertical axis is on the negative side, the value Zimg (abnormal) of the imaginary-axis component of the abnormal module is smaller than the value Zimg (normal) of the imaginary-axis component of the normal module; namely, Zimg (abnormal)<<Zimg (normal). Absolute values of these components assume a relationship of |Zimg (abnormal)|>>|Zimg (normal)|. The same also applies even to a case where two or more cells of the six cells exhibit an abnormal capacity balance. The applicants of the present patent application confirmed that a value of an imaginary-axis component of a complex impedance of the abnormal module is greatly different from a value of an imaginary-axis component of a complex impedance of a normal module. Accordingly, it is possible to identify whether a module to be determined is a normal module or an abnormal module including at least one cell with an abnormal capacity balance, by means of paying attention to; for instance, the imaginary-axis component of the complex impedance in the diffusion region and comparing a magnitude (an absolute value) of the component with a predetermined threshold value.

Figure 21:
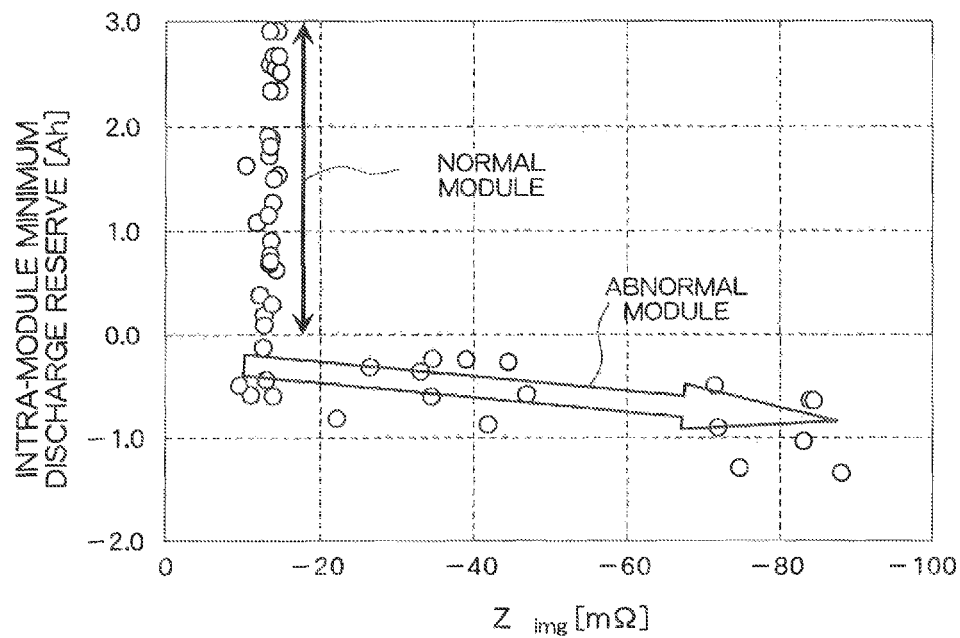
FIG. 21 It is a graph chart illustrating a relationship between a minimum discharge reserve in the normal module and an imaginary-axis component of a complex impedance of the normal module and a relationship between a minimum discharge reserve in the abnormal module and an imaginary-axis component of a complex impedance of the abnormal module.

FIG. 21 illustrates a relationship between an imaginary-axis component Zimg of a complex impedance in the diffusion region; for instance, 0.1 Hz, and the minimum discharge reserve in the module. A horizontal axis represents the imaginary-axis component Zimg of the complex impedance, and a right side of the horizontal axis is on a negative side. When all cells making up a module exhibit a normal capacity balance, the minimum discharge reserve assumes a value of 0 or a positive value (see FIG. 1). In the meantime, when at least any of the cells that make up the module exhibits an unbalanced capacity, the minimum discharge reserve in the module reflects a discharge reverse of the cell with the abnormal capacity balance, showing a negative value (see FIG. 3). As is seen from the chart, in the normal module that shows a minimum discharge reserve of 0 or a positive minimum discharge reserve, a value of the imaginary-axis component of the complex impedance is nearly constant. However, in the abnormal module that shows a negative minimum discharge reserve, a value of the imaginary-axis component of the complex impedance has greatly changed. The negative value of the imaginary-axis component of the complex impedance tends to become greater with an increase in negative value of the discharge reserve. Specifically, in the normal module, no correlation exists between the minimum discharge reserve in the module and the value of the imaginary-axis component. On the contrary, in the abnormal module, a correlation comes to occur between the minimum discharge reserve in the module and the value of the imaginary-axis component. The normal module and the abnormal module can also be distinguished from each other even by means of the existence or absence of such a correlation.

Figure 22:
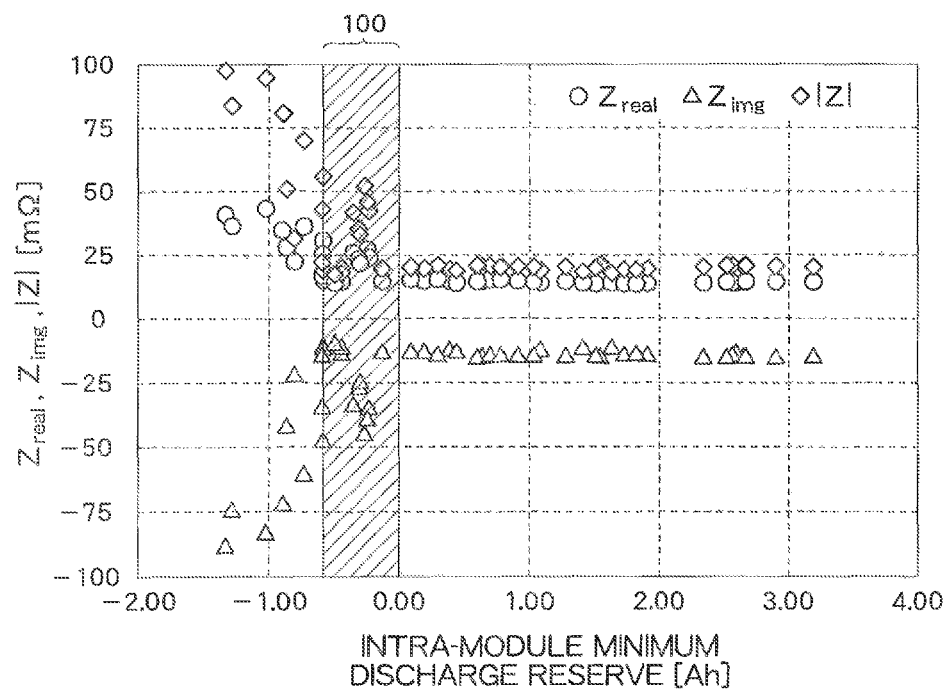
FIG. 22 It is a graph illustrating a relationship between the intra-module minimum discharge reserve and respective components of the complex impedance.

FIG. 22 illustrates a relationship among a real-axis component Zreal, an imaginary-axis component Zimg, a magnitude |Z| of the complex impedance of a complex impedance in the diffusion region; for instance, 0.1 Hz, and the minimum discharge reserve in the module. In the drawing, circular signs indicate the real-axis component Zreal; triangular signs indicate the imaginary-axis component Zimg; and rhombic signs designate the magnitude |Z|. In the normal module whose minimum discharge reserve is 0 or positive, the real-axis component Zreal, the imaginary-axis component Zimg, and the magnitude |Z| are all nearly constant without regard to the minimum discharge reserve. In the meantime, in an abnormal module whose minimum discharge reserve is negative, a value of the real-axis component Zreal and a value of the magnitude |Z| increase, whereas a value of the imaginary-axis component Zimg decreases. Accordingly, use of the real-axis component Zreal and the magnitude |Z| in place of the value of the imaginary-axis component or in addition to the value of the imaginary-axis component enables identification between the normal module and the abnormal module.

In FIG. 22, in a region 100 where the minimum discharge reserve in the module is negative but close to 0, changes do not necessarily occur in the real-axis component Zreal, the imaginary-axis component Zimg, and the magnitude |Z| in some cases. The following are conceivable reasons for this:

(1) An SOC of a real battery and an SOC acquired during computation of the discharge reserve differ from each other in terms of a definition.

(2) Since the module is assembled by a series connection of a plurality of cells, variations occur in each of the cells. In relation to reason (1), the following is conceivable. Namely, when an SOC assumes a value of 0% (in other words, when the minimum discharge reserve in the module assigned to the horizontal axis illustrated in FIG. 22 is 0 Ah) acquired during computation of the discharge reserve, a nominal dischargeable capacity is left in the positive electrode of the battery having a 0% SOC. In the battery having the 0% SOC, even when the discharge reserve is positive, the "discharge reserve may be negative" in the SOC acquired during computation of the discharge reserve.

Figure 23:
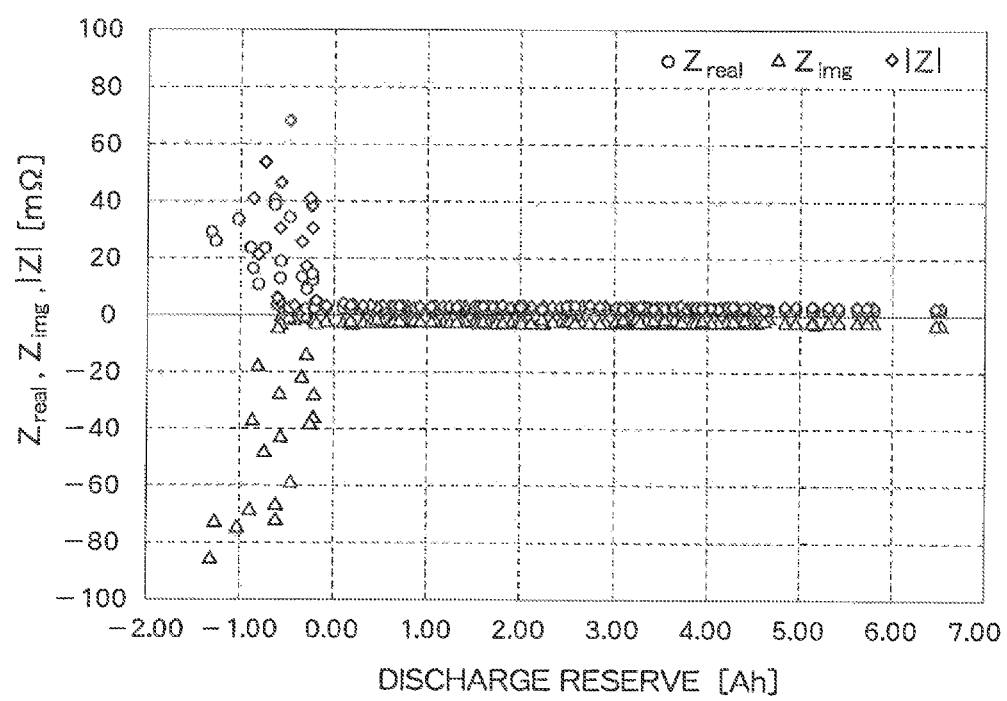
FIG. 23 It is a graph chart illustrating a relationship between a cell discharge reserve and the respective components of the complex impedance.

In relation to reason (2), FIG. 23 illustrates a per-cell relationship between a discharge reserve and a complex impedance at 0.1 Hz. As indicated by arrow 200 in the chart, it is understood that, even when the discharge reserve is negative until the discharge reserve comes to about −0.6 (Ah), there are also cells whose complex impedances remain unchanged.

Accordingly; for instance, there are cases where, even when attention is paid to the imaginary-axis component and when the imaginary-axis component is compared with the threshold value, difficulty is encountered in detecting an abnormal module in which the minimum discharge reserve is negative. However, so long as a threshold value is set to a pertinent value; for instance, the threshold value of the imaginary-axis in FIG. 22 is set to 50 mΩ, an abnormal module in which the minimum discharge reserve deviates toward the negative side by a given value or more; in other words, a module that is evidently abnormal because of a great deviation of the capacity balance.

Figure 24:
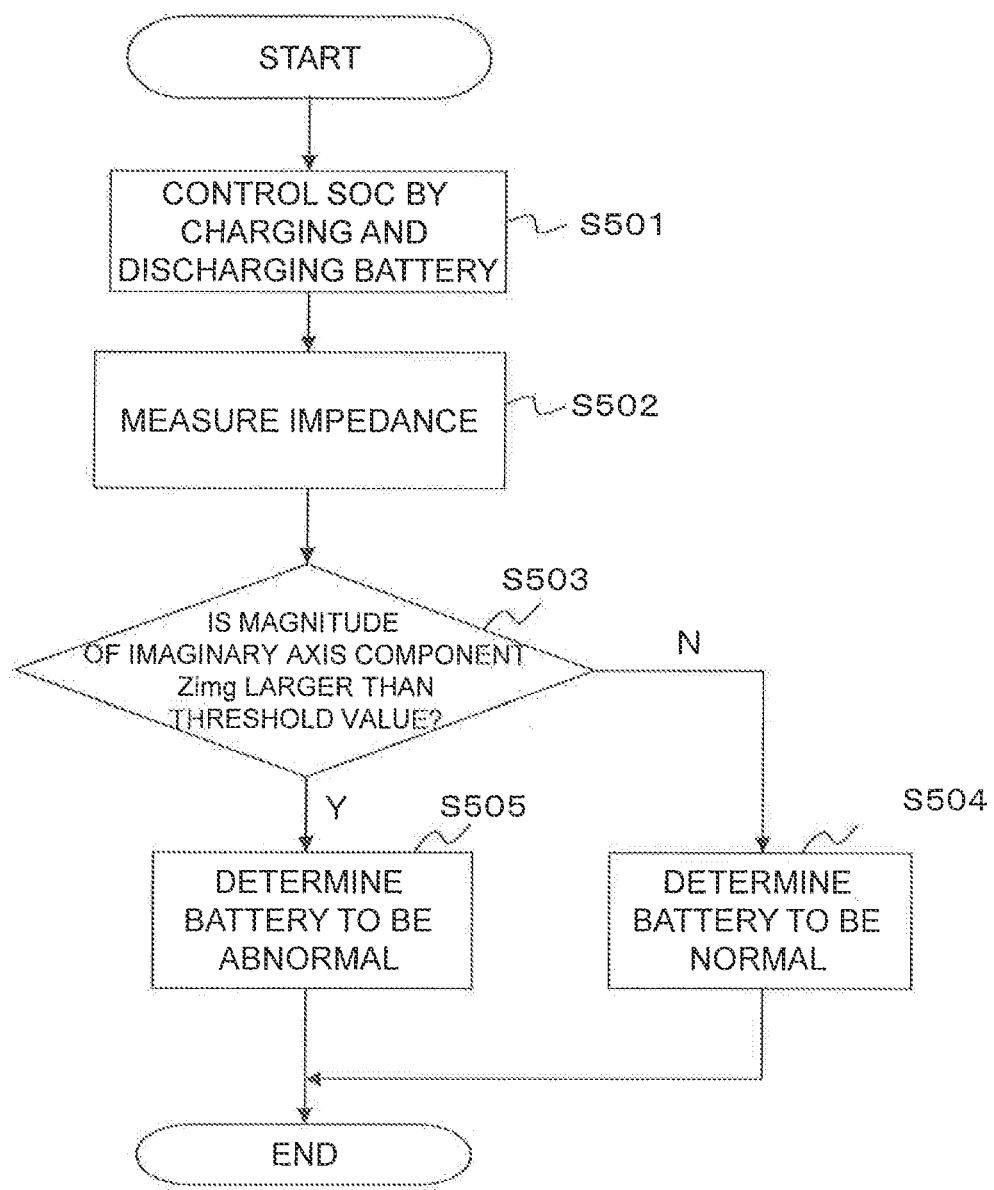
FIG. 24 It is a flowchart of the third embodiment.

FIG. 24 illustrates a processing flowchart of the embodiment. First, the battery 10 to be detected is charged and discharged to thereby control a state of charge (SOC) (S501). To be specific, the battery 10 is discharged until its SOC comes to 0% or thereabouts. The expression "0% or thereabouts" means a case where the SOC is 0% and a nominal charge state that can be deemed to be substantially 0%; for instance, about 0% to 5%. In a normal battery, the capacity of the positive electrode comes to 0 Ah by means of this control, and the capacity of the negative electrode still remains (a discharge reserve is positive). In the meantime, in an abnormal battery, the capacity of the negative electrode comes to 0 Ah (the discharge reserve is negative). In this regard, the battery is discharged until its SOC comes to "0% or thereabouts" in the embodiment. The reason for this is that a determination can be made with superior accuracy as to whether the capacity balance is normal or abnormal because a small deviation (abnormality) of the reserve can be detected at a low SOC. An SOC achieved after discharge; however, shall not be limited to "0% or thereabouts." For instance, in the case of only the necessity to detect only a large deviation of the reserve, the SOC can also be greater than "0% or thereabouts."

Next, the measurement electrodes are connected to the battery 10, and the AC voltage or the AC current is applied to the electrodes, whereby a complex impedance of the battery 10 is measured with the impedance measuring instrument 12 that is measurement means for measuring a complex impedance of the battery 10 (S502). A frequency of the AC voltage to be applied to the battery 10 is one that falls in the diffusion region; for instance, 0.1 Hz and 1 Hz. However, the frequency of the AC voltage shall not be limited to the values. In general, the frequency can be set to an arbitrary frequency of 1 Hz or less.

Next, the computer 14 serving as detection means has memory that preliminarily stores a threshold value used for determining whether the battery is normal or abnormal. A magnitude |Zimg| of the imaginary-axis component Zimg is calculated from data pertinent to a complex impedance of a frequency measured by the impedance measurement device 12, and the magnitude is compared with the threshold value (S503). When the computed magnitude is larger than the threshold value, the battery is determined to be abnormal (S505). Otherwise, the battery is determined to be normal (S504). As a matter of course, a permissible margin can also be set on the threshold value. Only when the magnitude is smaller than the threshold value in excess of the permissible margin, the battery can be determined to be abnormal or deteriorated. In this case, a determination can also be made, with a higher degree of accuracy, as to whether the battery is normal or abnormal by means of another determination method.

As above, in the embodiment, a battery can be readily determined to be normal or abnormal from a complex impedance of one frequency in the diffusion region. In this regard, in the embodiment, the battery is determined to be normal or abnormal by comparing the imaginary-axis component Zimg with the threshold value. Since the imaginary-axis component Zimg reflects an abnormal capacity balance (unbalance) most faithfully, a determination can be preferably made as to whether the capacity balance is normal or abnormal (unbalance). In the meantime, the real-axis component Zreal reflects an abnormality due to an increase in solution resistance or component resistance as well as the abnormal capacity balance (unbalance). Use of Zreal enables preferable performance of a determination as to whether or not the battery is abnormal attributable to an increase in solution resistance or component resistance. Reasons for an increase in solution resistance or component resistance include depletion of an electrolyte, a fall in electric conductivity of the electrolyte caused by impurities, and an increase in resistance caused by deterioration of components. In addition, a determination can be made at least as to whether the capacity balance is normal or abnormal or whether or not there is abnormality due to an increase in solution resistance or component resistance, by use of the magnitude |Z| of the complex impedance that exhibits both Zimg and Zreal.

The embodiment provides explanations by taking, as an example, a module in which one of a plurality of cells is abnormal. However, even when two or more cells are abnormal, changes occur in the real-axis component, the imaginary-axis component, and the magnitude of the complex impedance. Accordingly, the abnormal cells can be detected by comparing the factors with the respective threshold values.

<Fourth Embodiment>

In the third embodiment, detecting whether the battery is normal or abnormal is performed while attention is paid to a complex impedance of one frequency; for instance, 0.1 Hz, in the diffusion region. However, it is also possible to detect whether the battery is normal or abnormal by paying attention to complex impedances of a plurality of frequencies; for instance, 0.1 Hz and 1 Hz, in the diffusion region. Specifically, the lower the frequency of the AC voltage to be applied becomes, the greater a change in complex impedance of an abnormal battery becomes. It is possible to detect whether the battery is normal or abnormal with a corresponding degree of accuracy. However, detection involves consumption of much time. In the meantime, when the frequency of an AC voltage to be applied is relatively high, a change in complex impedance of the abnormal battery is relatively small. Consequently, the precision of detection is accordingly deteriorated, but the time required for detection can be shortened (the detection using a complex impedance of 1 Hz requires only one-tenth of the time required to perform the detection that uses a complex impedance of 0.1 Hz)

For this reason, in the embodiment, the computer 14 first detects whether a battery is normal or abnormal by use of a high frequency that makes precision relatively low but enables detection in a short period of time. The computer 14 then detects whether the battery is normal or abnormal by use of a low frequency that enables performance of highly accurate detection.

Figure 25:
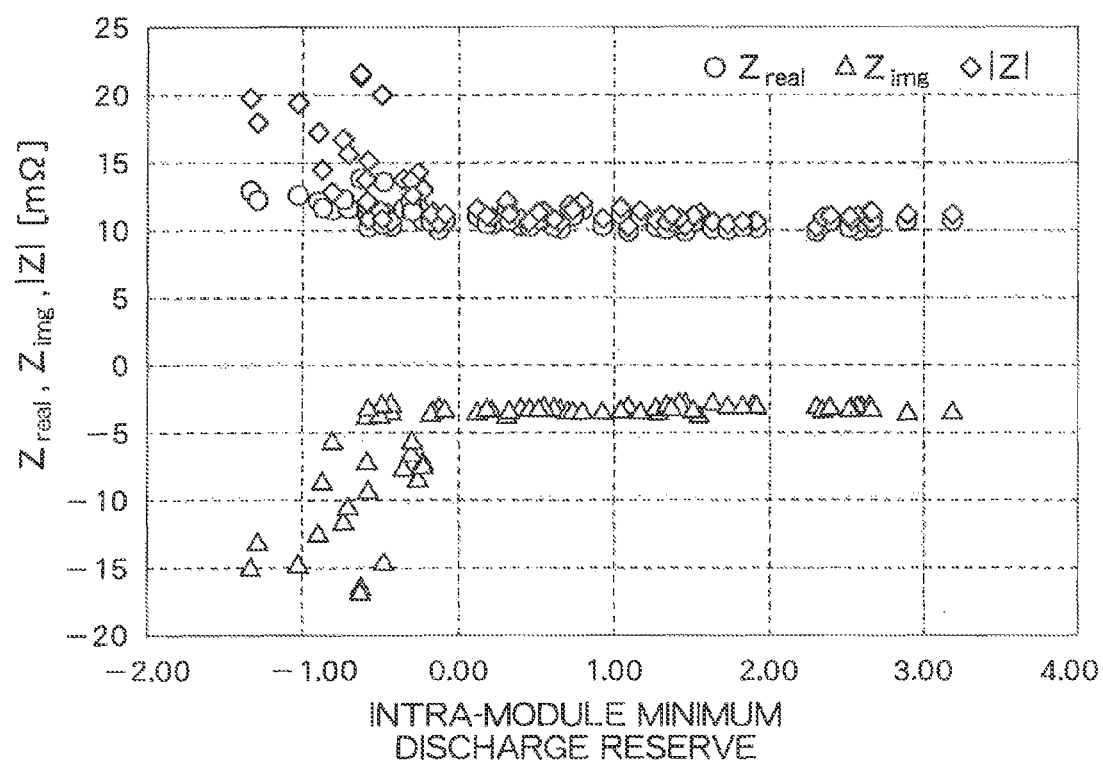
FIG. 25 it is a graph chart illustrating a relationship between an intra-module minimum discharge reserve at a different frequency (1 Hz) and respective components of the complex impedance.

FIG. 25 illustrates a relationship among the real-axis component Zreal, the imaginary-axis component Zimg, and the magnitude |Z| of a complex impedance measured at 1 Hz and an optimum discharge reserve in the module. A difference between FIG. 25 and FIG. 22 lies in that FIG. 22 illustrates the complex impedance of 0.1 Hz and that FIG. 25 illustrates the complex impedance of 1 Hz. Even in FIG. 25, a real-axis component and a magnitude of the real-axis component increase in an abnormal module in which the minimum discharge reserve is negative, and an imaginary-axis component of the complex impedance decreases. However, when compared with the case illustrated in FIG. 22, degrees of the changes are relatively small. Accordingly, attention is paid to; for instance, the imaginary-axis component, and the magnitude of the imaginary-axis component is compared with a corresponding threshold value (the threshold value referred to herein is a threshold value that differs from the threshold value employed in connection with the third embodiment), whereby it is possible to quickly detect whether the battery is normal or abnormal.

Figure 26:
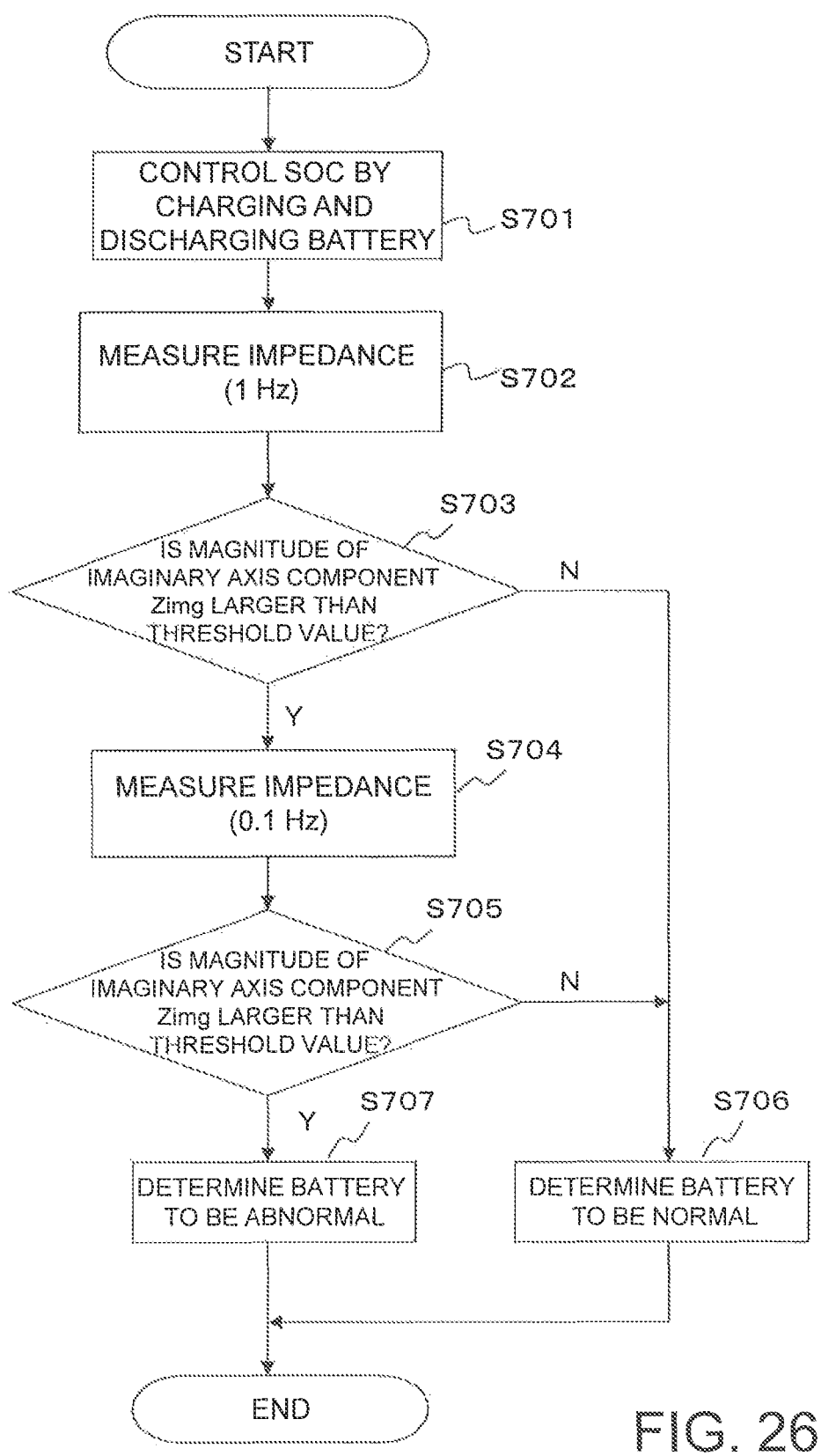
FIG. 26 It is a processing flowchart of a fourth embodiment.

FIG. 26 shows a processing flowchart of the embodiment. First, the battery 10 to be detected is charged and discharged to thereby control a state of charge (SOC) (S701). Specifically, the battery 10 is discharged until the SOC comes to 0% or thereabouts. As in the first embodiment, the expression "0% or thereabouts" means a case where the SOC is 0% and a nominal charge state that can be deemed to be substantially 0%; for instance, about 0% to 5%. In a normal battery, the capacity of the positive electrode comes to 0 Ah by means of this control, and the capacity of the negative electrode still remains (the discharge reserve is positive). However, in an abnormal battery, the capacity of the negative electrode comes to 0 Ah (the discharge reserve is negative).

Next, the measurement electrodes are connected to the battery 10, and the AC voltage or the AC current is applied to the electrodes. A complex impedance of the battery 10 is measured with the impedance measuring instrument 12 (S702). A frequency of the AC voltage to be applied to the battery 10 is one that falls in the diffusion region; for instance, 1 Hz. However, the frequency of the AC voltage is not limited to this value.

Next, the computer 14 serving as detection means has memory that preliminarily stores a threshold value used for determining whether the battery is normal or abnormal. A magnitude |Zimg| of the imaginary-axis component Zimg is calculated from data pertaining to a complex impedance of the frequency measured by the impedance measurement device 12, and the magnitude is compared with a threshold value for 1 Hz (S703). When the computed magnitude is not larger than the threshold value for 1 Hz, the battery is determined to be normal (S706). In the meantime, when the computed magnitude is larger than the threshold value for 1 Hz, the battery is not immediately determined to be abnormal. The AC voltage or the AC current is further applied to the battery 10, and a resultant complex impedance of the battery 10 is measured with the impedance measuring instrument 12 (S704). A frequency of the AC voltage to be applied to the battery 10 is a frequency that falls in the diffusion region and that is lower than 1 Hz; for instance, 0.1 Hz. The computer 14 computes a magnitude |Zimg| of the imaginary-axis component Zimg from the complex impedance data of a frequency (0.1 Hz) by the impedance measuring instrument 12, and compares the thus-computed magnitude with a threshold value for 0.1 Hz (S705). Even when YES is rendered as a determination in S203, the battery is not immediately determined to be abnormal. Attention is further paid to the complex impedance of 0.1 Hz. The reason for this is to prevent a battery, which is originally normal, from being erroneously determined to be abnormal because the determination rendered at 1 Hz is relatively lower in view of accuracy. When the magnitude acquired by computation is larger than the threshold value for 0.1 Hz; in other words, when both of the magnitudes acquired at 1 Hz and 0.1 Hz are larger than their respective threshold values, the battery 10 is definitely determined to be abnormal (S207). Meanwhile, when the magnitude acquired at 1 Hz is larger than the threshold value and when the magnitude acquired at 0.1 Hz is the threshold value or less, the battery is determined to be normal because the battery is determined to be normal by the measurement performed at 0.1 Hz that provides higher accuracy. Accordingly, the battery is finally determined to be normal (S706).

In the embodiment, the battery 10 that is given NO and determined to be normal in S703 does not need to undergo processing pertinent to S704 and subsequent steps. Since the battery 10 can be excluded from targets to be measured at 0.1 Hz, a total amount of determination time can be shortened.

In the embodiment, attention is paid basically to an imaginary-axis component Zimg of 1 Hz and the imaginary-axis component Zimg of 0.1 Hz as indicated by S703 and S705. However, the imaginary-axis components do not always need to be identical with each other and can be different from each other. For instance, attention is paid to the imaginary-axis component of 1 Hz in S703. However, an emphasis is put on accuracy in S705, and attention is paid to the imaginary-axis component Zimg and the real-axis component Zreal, or attention is paid to the imaginary-axis component Zimg, the real-axis component Zreal, and the magnitude |Z|, and these values are compared with their respective threshold values. When the imaginary-axis component Zimg, the real-axis component Zreal, and the magnitude |Z| all are greater than the respective threshold values, the battery can also be determined to be abnormal.

In the third and fourth embodiments, detecting whether the battery 10 is normal or abnormal can be performed in a non-destructive manner at ambient temperature (25 degrees centigrade). In particular, when a plurality of cells are connected in series and even when at least one of the cells is abnormal, the abnormal cell can be detected reliably. Hence, detecting whether the battery is normal or abnormal can be performed without fail in modules made up of a plurality of cells or in blocks made up of a plurality of modules. Accordingly, when the embodiments are applied to a vehicle-mounted battery, detecting whether the vehicle-mounted battery is normal or abnormal can be performed even during travel of the vehicle, so that an abnormal battery can be prevented from being recharged and discharged.

In the third and fourth embodiments, detecting whether the battery is normal or abnormal is performed by use of the Warburg impedance among the complex impedances. However, detecting whether the battery is normal or abnormal can also be performed even by use of the transmission-line-model impedance.

Moreover, in the third and fourth embodiments, the complex impedance is drawn as the Nyquist plot. However, the Bode diagram can also be used instead.

Further, in the third and fourth embodiments, detecting whether a battery is normal or abnormal is performed by use of at least any of the real-axis component Zreal, the imaginary-axis component Zimg, and the magnitude |Z| of the complex impedance. However, possible combinations of these factors are exemplified as follows:

(a) Compare a value or magnitude of the imaginary-axis component Zimg with its threshold value.

(b) Compare the value or magnitude of the imaginary-axis component Zimg with its threshold value, and compare a value or magnitude of the real-axis component Zreal with its threshold value.

(c) Compare the value or magnitude of the imaginary-axis component Zimg with its threshold value, and compare the magnitude |Z| with its threshold value.

(d) Compare the magnitude |Z| with its threshold value.

(e) Compare the value or magnitude of the real-axis component Zreal with its threshold value.

(f) Compare the value or magnitude of the real-axis component Zreal with its threshold value, and compare the magnitude |Z| with its threshold value.

The combinations (a) to (f) exemplify combinations of two factors selected from the real-axis component Zreal, the imaginary-axis component Zimg, and the magnitude |Z| of the complex impedance. However, a combination of all of the three factors is also available. Further, any one of the factors; that is, the real-axis component Zreal, the imaginary-axis component Zimg, and the magnitude |Z| of the complex impedance, can be used twice or more while the frequency is being changed.

The combination of the real-axis component Zreal, the imaginary-axis component Zimg, and the magnitude |Z| of the complex impedance also enables identification of which factor; namely, the abnormal capacity balance (which Zimg greatly reflects) or the abnormality due to an increase in solution resistance or component resistance (which Zreal greatly reflects) is greatly ascribable to the abnormality of the battery.

In this regard, the frequency of the diffusion region varies according to a type and a temperature of the rechargeable battery. Hence, a value of a frequency to be measured can be set as appropriate in accordance with various conditions.

Additionally, the third and fourth embodiments have mentioned, as the rechargeable battery, the module made up of the plurality of series-connected cells. The present invention; however, enables detection of a state of even a single cell by comparing any one of the real-axis component, the imaginary-axis component, and the magnitude of the complex impedance with its threshold value.

The invention claimed is:

1. A battery state detection device that detects whether a battery is normal or abnormal or a degree of deterioration of the battery, comprising:
    measurement means for measuring complex impedances in a diffusion region of the battery;
    detection means for calculating a slope of a straight line or an approximate straight line which connects together two or more complex impedances of different frequencies in a diffusion region of the battery measured by the measurement means; and
    storage means that stores a predetermined threshold value corresponding to the slope used for determining whether the battery is normal or abnormal or the degree of deterioration of the battery, wherein
    the detection means detects whether the battery is normal or abnormal or the degree of deterioration of the battery by use of the predetermined threshold value stored in the storage means and the calculated slope.

2. The battery state detection device according to claim 1, wherein the two or more complex impedances of different frequencies are complex impedances measured at an identical state of charge.

3. The battery state detection device according to claim 2, wherein the state of charge is 0% to 5%.

4. The battery state detection device according to claim 1, wherein the detection means calculates the slope of the straight line or the approximate straight line that connects together the two or more complex impedances of different frequencies, by use of a two-dimensional plane defined by an axis of real-axis components and an axis of imaginary-axis components.

5. A battery state detection device that detects whether a battery is normal or abnormal or a degree of deterioration of the battery, comprising:

measurement means for measuring a complex impedance in a diffusion region of the battery which is identical with a frequency of a reference complex impedance, or a complex impedance in a diffusion region, of a base battery that serves as a reference for comparison of the battery;

detection means for detecting a distance between the reference complex impedance and the complex impedance measured by the measurement means and a slope of a straight line that connects the reference complex impedance to the complex impedance measured by the measurement means; and storage means that stores a threshold value corresponding to the distance and a threshold value corresponding to the slope, which are used for determining whether the battery is normal or abnormal or the degree of deterioration of the battery, wherein the detection means detects whether the battery is normal or abnormal or the degree of deterioration of the battery by use of the calculated distance, the calculated slope, the threshold value corresponding to the distance stored in the storage means, and the threshold value corresponding to the slope stored in the storage means.

6. The battery state detection device according to claim 5, wherein the reference complex impedance and the complex impedance measured by the measurement means are complex impedances measured at an identical state of charge.

7. The battery state detection device according to claim 6, wherein the state of charge is 0% to 5%.

8. The battery state detection device according to claim 5, wherein the detection means detects, by use of a two-dimensional plane defined by an axis of real-axis components and an axis of imaginary-axis components, a distance between the complex impedance measured by the measurement means and the reference complex impedance and a slope of a straight line that connects the complex impedance measured by the measurement means to the reference complex impedance.

9. A battery state detection device for detecting whether a battery is normal or abnormal, comprising:

measurement means for measuring a complex impedance of a first frequency in a diffusion region of the battery;

detection means for calculating at least any one of a real-axis component, an imaginary-axis component, and a magnitude of the complex impedance of the first frequency measured by the measurement means; and storage means that stores a predetermined threshold value corresponding to at least any one of the real-axis component, the imaginary-axis component, and the magnitude of the complex impedance of the first frequency, which is acquired by the measurement means and used for determining whether the battery is normal or abnormal, wherein the detection means detects whether the battery is normal or abnormal by comparing at least any one of the real-axis component, the imaginary-axis component, and the magnitude of the complex impedance of the first frequency with the predetermined threshold value corresponding to at least any one of the real-axis component, the imaginary-axis component, and the magnitude of the complex impedance of the first frequency stored in the storage means.

10. The battery state detection device according to claim 9, wherein, when the detection means has detected that the battery is abnormal, the measurement means measures a complex impedance of a second frequency which is lower than the first frequency in the diffusion region of the battery;

the detection means calculates at least one of a real-axis component, an imaginary-axis component, and a magnitude of the complex impedance of the second frequency measured by the measurement means;

the storage means preliminarily stores a predetermined threshold value corresponding to at least any one of the real-axis component, the imaginary-axis component, and the magnitude of the complex impedance of the second frequency that is acquired by the measurement means and used for determining the battery is normal or abnormal; and the detection means detects whether the battery is normal or abnormal by comparing at least any one of the real-axis component, the imaginary-axis component, and the magnitude of the complex impedance of the second frequency with the predetermined threshold value corresponding to at least any one of the real-axis component, the imaginary-axis component, and the magnitude of the complex impedance of the second frequency stored in the storage means.

11. The battery state detection device according to claim 9, wherein the measurement means measures a complex impedance which occurs when the state of charge of the battery is 0% to 5%.

* * * * *